United States Patent
Moon et al.

(10) Patent No.: US 12,402,493 B2
(45) Date of Patent: Aug. 26, 2025

(54) INORGANIC LAYER STRUCTURE IN BENDING AREA OF DISPLAY DEVICE AND METHOD OF PROVIDING THE SAME

(71) Applicant: Samsung Display Co., LTD., Yongin-si (KR)

(72) Inventors: Youhan Moon, Bucheon-si (KR); Deokhoi Kim, Seongnam-si (KR); Swae-Hyun Kim, Asan-si (KR); Jeongho Lee, Asan-si (KR); Jung-Woo Ha, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1 day.

(21) Appl. No.: 18/489,939

(22) Filed: Oct. 19, 2023

(65) Prior Publication Data

US 2024/0049502 A1 Feb. 8, 2024

Related U.S. Application Data

(62) Division of application No. 17/209,498, filed on Mar. 23, 2021, now Pat. No. 11,832,471.

(30) Foreign Application Priority Data

Jun. 30, 2020 (KR) .................. 10-2020-0080570

(51) Int. Cl.
*H10K 50/844* (2023.01)
*H10K 59/12* (2023.01)
(Continued)

(52) U.S. Cl.
CPC ......... *H10K 50/844* (2023.02); *H10K 59/121* (2023.02); *H10K 59/122* (2023.02);
(Continued)

(58) Field of Classification Search
CPC .. H10K 50/844; H10K 59/131; H10K 59/122; H10K 59/121; H10K 59/1201; H10K 71/00; H10K 77/111
(Continued)

(56) References Cited

U.S. PATENT DOCUMENTS 8,465,995 B2 6/2013 Jung et al.
8,476,123 B2 7/2013 Yang et al.
(Continued)

FOREIGN PATENT DOCUMENTS

CN 102347274 A 2/2012
CN 102854682 A 1/2013
(Continued)

*Primary Examiner* — Eric W Jones
(74) *Attorney, Agent, or Firm* — CANTOR COLBURN LLP

(57) ABSTRACT

A method includes providing an active pattern and gate metal patterns, and inorganic insulation layers respectively therebetween in a pixel area and each extending to a bending area, providing a first photoresist pattern defining a first opening in the bending area, providing by using the first photoresist pattern, at least one of the inorganic layers in the bending area which is etched, providing a remaining photoresist pattern defining a first remaining opening corresponding to the first opening and a second opening corresponding to the active pattern, and providing by using the remaining photoresist pattern, both a contact hole corresponding to the second opening and exposing the portion of the active pattern to outside the remaining photoresist pattern, and a portion of the base substrate corresponding to the first remaining opening and exposed to outside the remaining photoresist pattern.

10 Claims, 16 Drawing Sheets

(51) Int. Cl.
  *H10K 59/121* (2023.01)
  *H10K 59/122* (2023.01)
  *H10K 59/131* (2023.01)
  *H10K 71/00* (2023.01)
  *H10K 77/10* (2023.01)

(52) U.S. Cl.
  CPC ........... *H10K 59/131* (2023.02); *H10K 71/00* (2023.02); *H10K 77/111* (2023.02); *H10K 59/1201* (2023.02)

(58) Field of Classification Search
  USPC .......................................................... 257/40
  See application file for complete search history.

(56) References Cited

U.S. PATENT DOCUMENTS

| | | | |
|---|---|---|---|
| 10,658,628 B2 | 5/2020 | Lee | ............ H01L 27/3276 |
| 10,672,841 B2 | 6/2020 | Kim et al. | |
| 10,797,123 B2 | 10/2020 | Cho et al. | |
| 11,088,284 B2 | 8/2021 | Son | ............ H01L 27/1222 |
| 2010/0051956 A1 | 3/2010 | You | ............ H01L 27/1288 349/1 |
| 2011/0086450 A1 | 4/2011 | Nam et al. | |
| 2017/0288007 A1 | 10/2017 | Shin et al. | |
| 2018/0342707 A1 | 11/2018 | Lee | ............ H01L 51/0097 |
| 2018/0366586 A1* | 12/2018 | Son | ............ H01L 27/1218 |
| 2020/0161569 A1 | 5/2020 | Yu et al. | |
| 2021/0111232 A1 | 4/2021 | Park | ............ H01L 51/0023 |
| 2021/0184139 A1* | 6/2021 | Zhang | ............ H10K 77/111 |

FOREIGN PATENT DOCUMENTS

| | | |
|---|---|---|
| CN | 108074958 A | 5/2018 |
| CN | 108389884 A | 8/2018 |
| CN | 110828479 A | 2/2020 |
| KR | 1020190025424 A | 3/2019 |
| KR | 1020190073848 A | 6/2019 |
| KR | 1020190081674 A | 7/2019 |
| KR | 20190098311 A | 8/2019 |
| KR | 1020190108224 A | 9/2019 |
| KR | 10-2037883 B1 | 10/2019 |

* cited by examiner

INORGANIC LAYER STRUCTURE IN BENDING AREA OF DISPLAY DEVICE AND METHOD OF PROVIDING THE SAME

This application is a divisional application of U.S. application Ser. No. 17/209,498 filed Mar. 23, 2021, which claims priority to Korean Patent Application No. 10-2020-0080570 filed on Jun. 30, 2020, and all the benefits accruing therefrom under 35 U.S.C. § 119, the content of which is incorporated by reference for all purposes as if fully set forth herein.

BACKGROUND

1. Field

Embodiments relate to a display device. More particularly, embodiments relate to a display device including a bending area and a method of providing the display device.

2. Description of the Related Art

An organic light-emitting display device self-emits light without a separate light source. The organic light-emitting display device has reduced weight and thickness and has characteristics appropriate for a display device.

A display panel of the organic light-emitting display device may include a flexible base substrate including or formed from a polymeric material.

SUMMARY

Embodiments provide a method for providing or manufacturing display device which reduces the number of etching masks.

Embodiments provide a display device including a bending area.

According to an embodiment, a method for providing or manufacturing a display device is provided. According to the method, a first inorganic layer is provided on a base substrate including a pixel area and a bending area. A second inorganic layer is provided on the first inorganic layer. An active pattern is provided on the second inorganic layer in the pixel area. A third inorganic layer is provided to cover the active pattern. A first gate metal pattern including a gate electrode is provided on the third inorganic layer. The gate electrode overlaps the active pattern. A fourth inorganic layer is provided to cover the first gate metal pattern. A second gate metal pattern is provided on the fourth inorganic layer in the pixel area. A fifth inorganic layer is provided to cover the second gate metal pattern. A first photoresist pattern is provided on the fifth inorganic layer. At least one of the inorganic layers is etched under the first opening of the first photoresist pattern in the bending area. The first photoresist pattern is partially removed to form a remaining photoresist pattern including a first opening overlapping the bending area and a second opening overlapping a portion of the active pattern. At least one of the inorganic layers are etched under the first opening and the second opening of the remaining photoresist pattern to form a first contact hole exposing the active pattern and to expose at least a portion of the base substrate in the bending area.

In an embodiment, the first to fifth inorganic layers may each include at least one of silicon oxide, silicon nitride and silicon oxynitride.

In an embodiment, etching the inorganic layers under the first opening of the first photoresist pattern may remove at least the fifth inorganic layer, the fourth inorganic layer and the third inorganic layer.

In an embodiment, etching the inorganic layers under the first opening of the first photoresist pattern may remove at least the fifth inorganic layer, the fourth inorganic layer, the third inorganic layer and a portion of the second inorganic layer.

In an embodiment, a sum of thicknesses of the inorganic layers etched under the first opening of the first photoresist pattern may be larger than a sum of thicknesses of the inorganic layers etched under the first opening of the remaining photoresist pattern.

In an embodiment, a first source metal pattern may be provided on the fifth inorganic layer. The first source metal pattern may include a source pattern and a transfer wiring. The source pattern may electrically contact the active pattern through the first contact hole. The transfer wiring may be in the bending area.

In an embodiment, the active pattern may include polysilicon.

According to an embodiment, a method for providing or manufacturing a display device is provided. According to the method, a first inorganic layer is provided on a base substrate including a pixel area and a bending area. A second inorganic layer is provided on the first inorganic layer. A first active pattern is provided on the second inorganic layer in the pixel area. A third inorganic layer is provided to cover the first active pattern. A first gate metal pattern including a gate electrode is provided on the third inorganic layer. The gate electrode overlaps the first active pattern. A fourth inorganic layer is provided to cover the first gate metal pattern. A second gate metal pattern is provided on the fourth inorganic layer in the pixel area. A fifth inorganic layer is provided to cover the second gate metal pattern. A second active pattern is provided on the fifth inorganic layer in the pixel area. A sixth inorganic layer is provided to cover the second active pattern. A third gate metal pattern including a second gate electrode is provided on the sixth inorganic layer. The second gate electrode overlaps the second active pattern. A seventh inorganic layer is provided to cover the third gate metal pattern. A first photoresist pattern is provided on the seventh inorganic layer. At least one of the inorganic layers is etched under the first opening and the second opening of the first photoresist pattern. The first photoresist pattern is partially removed to form a remaining photoresist pattern including a first opening overlapping the bending area, a second opening overlapping a portion of the first active pattern, and a third opening overlapping a portion of the second active pattern. At least one of the inorganic layers are etched under the first opening, the second opening and the third opening of the remaining photoresist pattern to form a first contact hole exposing the active pattern and a second contact hole exposing the second active pattern.

According to an embodiment, a display device includes a base substrate including a pixel area and a bending area, a barrier layer on the base substrate, an active pattern on the barrier layer in the pixel area, a first insulation layer covering the active pattern, a first gate metal pattern on the first insulation layer and including a gate electrode overlapping the active pattern, a second insulation layer covering the first gate metal pattern, a second gate metal pattern on the second insulation layer in the pixel area, a third insulation layer covering the second gate metal pattern, a source metal pattern on the third insulation layer, a via insulation layer on the source metal pattern, and an organic light-emitting diode on the via insulation layer. An inorganic layer is excluded in the bending area. Side surfaces of inorganic layers which are vertically stacked are connected to each other at a boundary of the bending area thereby providing a straightly extending side surface.

According to embodiments, inorganic layers in a pixel area and in a bending area may be removed through a same photolithography process. Thus, an additional photolithography process for individually etching the inorganic layers in the bending area may be removed.

Furthermore, since a stacked structure of the inorganic layers may have a straightly extending side surface at a boundary between the bending area and an area adjacent to the bending area without a protrusion protruding in a lateral direction, a size of a peripheral area (e.g., a non-display area) may be substantially reduced.

BRIEF DESCRIPTION OF THE DRAWINGS

Embodiments will be more clearly understood from the following detailed description taken in conjunction with the accompanying drawings.

DETAILED DESCRIPTION

Figure 1:
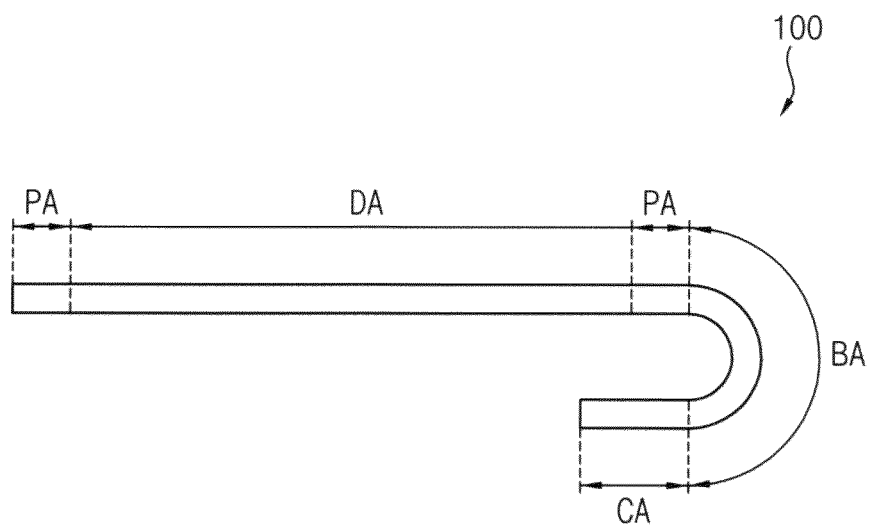
FIG. 1 is a cross-sectional view illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A display device 100 may be designed to include a bending area BA at which the display device 100 is bendable. An inorganic layer may be omitted in the bending area BA to reduce or effectively prevent cracking of the inorganic layer due to a bending stress applied to the bending area BA.

A display device 100 and a method of providing or manufacturing a display device 100 will be described hereinafter with reference to the accompanying drawings.

Figure 2:
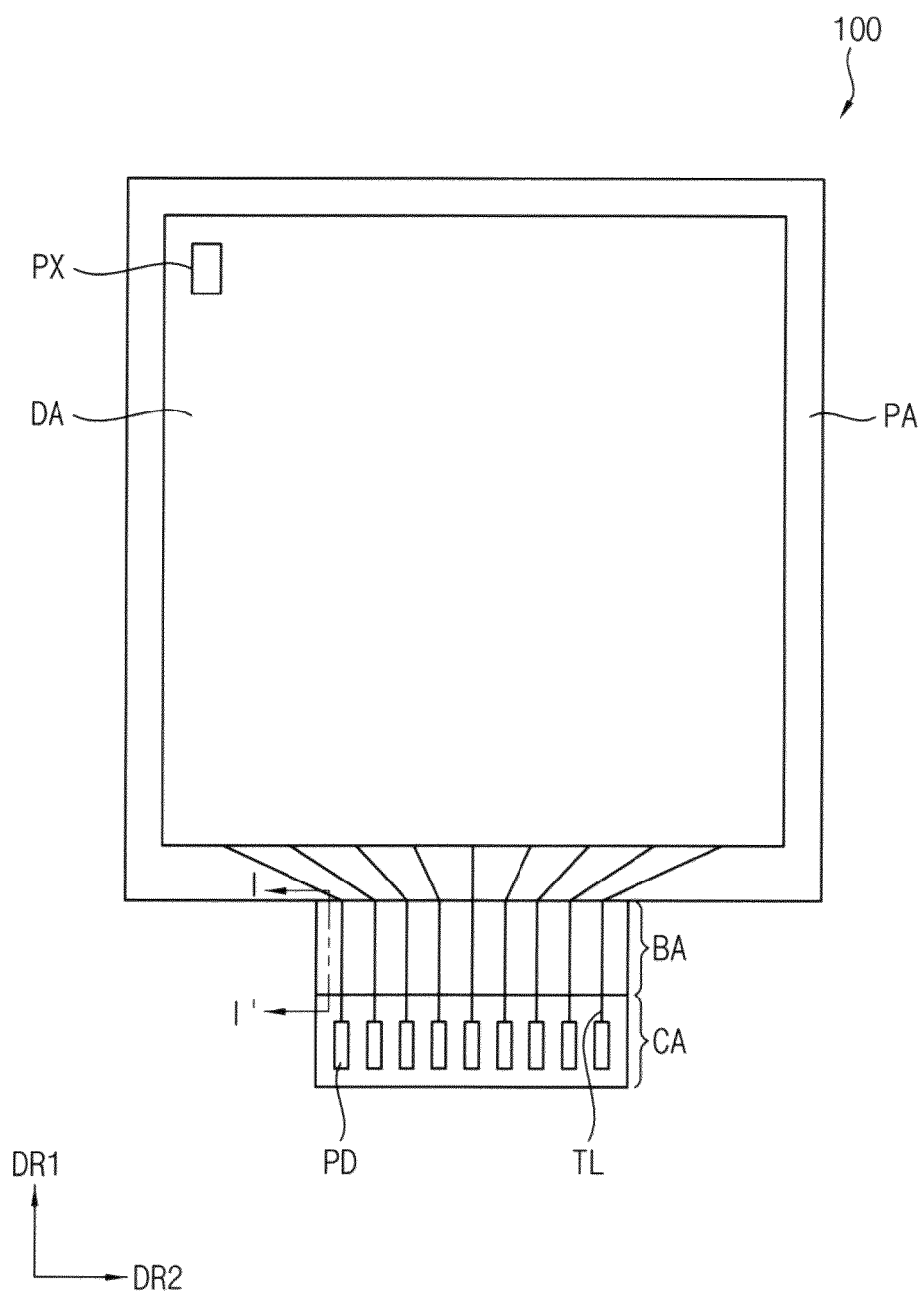
FIG. 2 is a plan view illustrating an embodiment of a display device.

FIG. 1 is a cross-sectional view illustrating an embodiment of a display device 100. FIG. 1 may illustrate the display device 100 which includes a bending area BA and a connection area CA and is folded or bent. FIG. 2 is a plan view illustrating an embodiment of a display device 100. FIG. 2 may illustrate the display device 100 which includes a bending area BA and a connection area CA in a plan view and is unfolded.

Referring to FIGS. 1 and 2, a display device 100 includes a display area DA and a peripheral area PA which is adjacent to the display area DA. The display area DA may include a pixel or pixel area PX provided in plural including a plurality of pixel areas PX. In an embodiment, a light-emitting element and a driving element which is electrically connected to the light-emitting element may be disposed in each of the pixel areas PX. In a plan view, the peripheral area PA may surround at least a portion of the display area DA.

The display device 100 may further include a bending area BA and a connection area CA. The bending area BA may extend from a side of the peripheral area PA. The bending area BA may be a planar area of the display device 100 at which the display device 100 and various layers thereof are bendable. Referring to FIG. 1, the display device 100 which is bent may bend the bending area BA downwardly along a thickness direction of the display device 100. The connection area CA may extend from the bending area BA and in a direction away from the display are DA. The peripheral area PA (e.g., non-display area) may include the connection area CA and the bending area BA, without being limited thereto. Various layers and elements in a final form of the display device 100 or in an intermediate structure for providing the display device 100 may include a display area DA, a peripheral area PA, a bending area BA and/or a connection area CA corresponding to those described above for the display device 100.

Referring to FIG. 1, the display device 100 which is bent at the bending area BA disposes the connection area CA under the display area DA and/or the peripheral area PA. Referring to FIG. 2, the display device 100 which is unfolded disposes the bending area BA between the display area DA and the connection area CA. The bending area BA may connect the connection area CA to the peripheral area PA and/or the display area DA.

The display device 100 may be electrically connected to a driving device, at the connection area CA. A connection pad PD may be provided in plural including a plurality of connection pads PD in the connection area CA. The connection pads PD may receive a driving signal or a power voltage from outside the display device 100. The connection pads PD may receive a driving signal or a power voltage from the driving device which is outside the display device 100.

The display device 100 may include a transfer wiring TL provided in plural including transfer wirings TL. The transfer wirings TL may be in the bending area BA and may extend from the bending area BA to the connection area CA, the peripheral area PA and/or the display area DA. The connection pads PD may be electrically connected to the transfer wirings TL disposed in the bending area BA and the peripheral area PA. The transfer wirings TL may transfer a driving signal or a power voltage to the pixel areas PX in the display area DA. In an embodiment, the method may include providing a transfer wiring TL through which an electrical signal is provided to the pixel area PX from outside the bending area BA. Furthermore, the transfer wirings TL may transfer a driving signal to a driving circuit disposed in the peripheral area PA. In an embodiment, for example, the transfer wirings TL may extend along a first direction DR1 in the bending area BA. The transfer wirings TL may be arranged along a second direction DR2 which crosses the first direction DR1. A thickness direction may be defined along a third direction which crosses each of the first direction DR1 and the second direction DR2.

FIGS. 3A, 3B, 4, 5A, 5B, 6A, 6B, 7A, 7B, 8A, 8B and 8C are cross-sectional views illustrating an embodiment of a method for providing or manufacturing a display device 100. FIGS. 3A, 5A, 6A, 7A and 8A may illustrate an enlarged cross-sectional view of an embodiment of a pixel area PX of a display device 100. FIGS. 3B, 4, 5B, 6B, 7B, 8B and 8C may illustrate an enlarged cross-sectional view of an embodiment of a bending area BA of a display device 100.

Figure 3A:
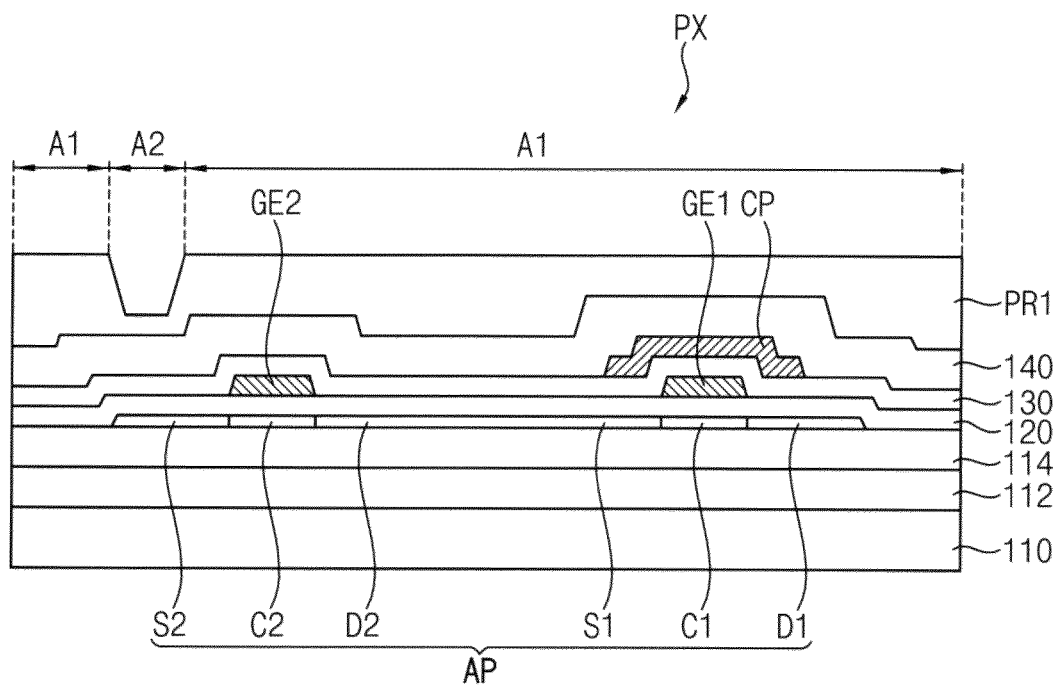
FIGS. 3A, 3B, 4, 5A, 5B, 6A, 6B, 7A, 7B, 8A, 8B and 8C are cross-sectional views illustrating an embodiment of a method for providing or manufacturing a display device.
Figure 3B:
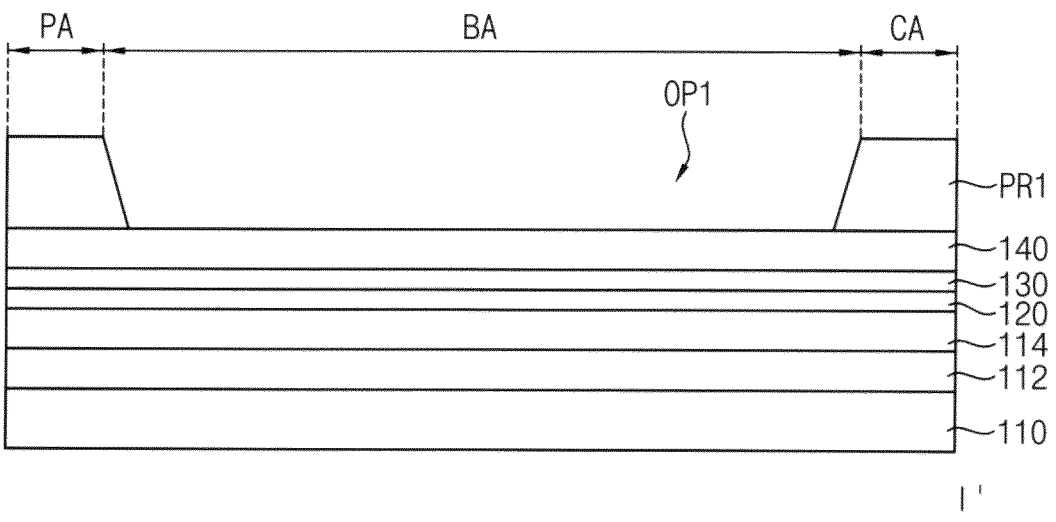

Referring to FIGS. 3A and 3B, a barrier layer 112 and a buffer layer 114 are provided or formed on a base substrate 110.

The base substrate 110 may include at least one polymer film. The polymer film may include polyethylene terephthalate, polyethylene naphthalate, polyether ketone, polycarbonate, polyarylate, polyether sulfone, polyimide or a combination thereof. In an embodiment, for example, the base substrate 110 may include at least two polymer films and an inorganic barrier layer which is disposed therebetween.

The barrier layer 112 and the buffer layer 114 may include an inorganic material (e.g., inorganic barrier layer and inorganic buffer layer). In an embodiment, for example, the barrier layer 112 and the buffer layer 114 may each include silicon oxide, silicon nitride, silicon oxynitride or a combination thereof, and may have a single-layered structure or a multi-layered structure. In an embodiment, the barrier layer 112 may include silicon oxide, and the buffer layer 114 may have a stacked structure including a lower layer including silicon nitride and an upper layer including silicon oxide.

An active pattern AP and a first insulation layer 120 which covers the active pattern AP are provided or formed on the buffer layer 114. A first gate metal pattern including a first gate electrode GE1 and a second gate electrode GE2 is provided or formed on the first insulation layer 120. The first gate electrode GE1 and the second gate electrode GE2 may be in a same layer among layers on the base substrate 110. As being in a same layer, elements or features may be respective patterns of a same material layer. Related to the first gate metal pattern, for example, the first gate electrode GE1 and the second gate electrode GE2 may be respective portions of a same first gate metal layer.

In an embodiment, for example, the active pattern AP may include multi-crystalline silicon (polysilicon). In an embodiment, for example, an amorphous silicon layer may be provided or formed on the buffer layer 114 and then crystallized to provide or form a polysilicon layer.

In an embodiment, for example, the amorphous silicon layer may be provided or formed through sputtering, low-pressure chemical vapor deposition ("LPCVD"), plasma-enhanced chemical vapor deposition ("PECVD") or the like. The amorphous silicon layer may be crystallized through excimer laser annealing ("ELA"), sequential lateral solidification ("SLS") or the like.

The polysilicon layer may be patterned by a photolithography or the like to provide or form a semiconductor pattern.

At least a portion of the semiconductor pattern may be doped with impurities. In an embodiment, the semiconductor pattern may be doped with p-type impurities such as boron or the like. However, embodiments are not limited thereto. In an embodiment, for example, the semiconductor pattern may be doped with n-type impurities such as phosphor, arsenic or the like. In an embodiment, for example, the semiconductor may have different concentrations of the n-type impurities in different portions.

In an embodiment, for example, the semiconductor pattern may be doped by using a first gate metal pattern or a photoresist pattern which is on the first gate metal pattern as a mask, after the first gate metal pattern is provided or formed on the first insulation layer 120.

As a result, a portion of the semiconductor pattern which does not overlap the first gate metal pattern, may be doped with the impurities to form a doped region. In an embodiment, for example, the active pattern AP as a doped semiconductor pattern may include a first channel region C1 overlapping or corresponding to the first gate electrode GE1 and a second channel region C2 overlapping or corresponding to the second gate electrode GE2. The doped portion of the active pattern AP may define a source region and a drain region. In an embodiment, for example, the active pattern AP may include a first source region S1, a first drain region D1, a second source region S2 and a second drain region D2, which are adjacent to the first channel region C1 and the second channel region C2. However, embodiments are not limited thereto. In an embodiment, for example, the active pattern AP may include at least three channel regions, at least three source regions and at least three drain regions depending on a configuration of a pixel circuit of the pixel area PX. The pixel circuit may include a gate electrode, a source electrode and a drain electrode together with the active pattern AP, without being limited thereto. In an embodiment, a pixel circuit may include in order from the base substrate 110, an active pattern AP, a first gate metal pattern corresponding to the active pattern AP, and a second gate metal pattern.

The first insulation layer 120 may include an inorganic material (e.g., first inorganic insulation layer), and may have a single-layered structure or a multiple-layered structure. In an embodiment, for example, the first insulation layer 120 may include silicon oxide, silicon nitride, silicon oxynitride or a combination thereof. Furthermore, the first insulation layer 120 may include an insulating metal oxide such as aluminum oxide, tantalum oxide, hafnium oxide, zirconium oxide, titanium oxide or a combination thereof. In an embodiment, the first insulation layer 120 may include silicon oxide. The first insulation layer 120 may be referred to as a first gate insulation layer.

In an embodiment, for example, a first gate metal layer is provided or formed on the first insulation layer 120, and then patterned to provide or form the first gate metal pattern including the first gate electrode GE1 and the second gate electrode GE2. A second insulation layer 130 is provided or formed on the first gate metal pattern. A second gate metal layer is provided or formed on the second insulation layer 130, and then patterned to form a second gate metal pattern including a capacitor pattern CP (e.g., capacitor electrode). A third insulation layer 140 is provided or formed on the second gate metal pattern.

The first and second gate metal layers may each include a metal, a metal alloy, a metal nitride, a conductive metal oxide or the like. In an embodiment, for example, the first and second gate metal layers may each include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multiple-layered structure including different metal layers.

In an embodiment, for example, at least a portion of the capacitor pattern CP may define a capacitor electrode of a storage capacitor. The second gate metal pattern may further include a signal wiring through which is transferred an electrical signal such as an initialization signal, a shielding pattern or the like.

The second and third insulation layers 130 and 140 may each include an inorganic material (e.g., second inorganic insulation layer and third inorganic insulation layer), and may have a single-layered structure or a multiple-layered structure. In an embodiment, for example, the second and third insulation layers 130 and 140 may each include silicon oxide, silicon nitride, silicon oxynitride or a combination thereof. Furthermore, the second and third insulation layers 130 and 140 may each include an insulating metal oxide such as aluminum oxide, tantalum oxide, hafnium oxide, zirconium oxide, titanium oxide or a combination thereof. In an embodiment, the second insulation layer 130 may include silicon nitride, and the third insulation layer 140 may include a lower layer including silicon oxide and an upper layer including silicon nitride which is further from the base substrate 110 than the lower layer. The second insulation layer 130 may be referred to as a second gate insulation layer, and the third insulation layer 140 may be referred to as a first interlayer insulation layer.

A first photoresist pattern PR1 is provided or formed on the third insulation layer 140. Referring to FIG. 3A, the first photoresist pattern PR1 may include a first portion A1 and a second portion A2 which have different thicknesses from each other and are both disposed in the pixel area PX. In an embodiment, for example, the second portion A2 may overlap or correspond to a portion of the active pattern AP. A second thickness of the first photoresist pattern PR1 at the second portion A2 may be smaller than a first thickness at the first portion A1. The first photoresist pattern PR1 may include an upper surface in both the first portion A1 and the second portion A2 which is furthest from the base substrate 110. The upper surface of the first photoresist pattern PR1 at the second portion A2 may be closer to the substrate than the upper surface at the first portion A1.

One or more of the above-mentioned layers may extend from the pixel area PX to the peripheral area PA, the bending area BA and the connection area CA. Referring to FIG. 3B, taken together with FIG. 3A, the barrier layer 112, the buffer layer 114, the first insulation layer 120, the second insulation layer 130 and the third insulation layer 140 may be disposed in the bending area BA.

A solid portion of the first photoresist pattern PR1 may not be disposed in (e.g., may be excluded from) the bending area BA. In an embodiment, for example, the first photoresist pattern PR1 may include or define a first opening OP1 overlapping or corresponding to the bending area BA. Thus, an upper surface of the third insulation layer 140 may be exposed to outside the first photoresist pattern PR1 at the bending area BA.

The first photoresist pattern PR1 having different thicknesses may be provided or formed by using half-tone light-exposure.

In an embodiment, the barrier layer 112, the buffer layer 114, the first insulation layer 120, the second insulation layer 130 and the third insulation layer 140 may be referred to as a first inorganic layer, a second inorganic layer, a third inorganic layer, a fourth inorganic layer and a fifth inorganic layer, respectively, or as inorganic layers collectively.

Figure 4:
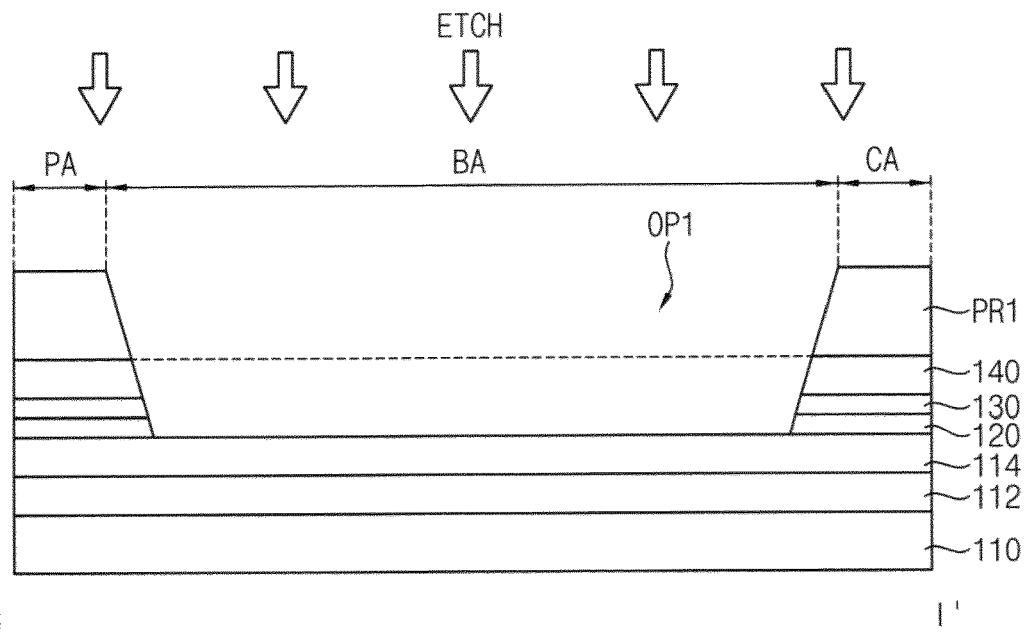

Referring to FIG. 4, in a first etching process (e.g., first inorganic layer etching process), the inorganic layers are etched in the bending area BA by using the first photoresist pattern PR1. In an embodiment, for example, the inorganic layers may be etched by a dry etching process. One or more of the inorganic layers may be etched at a same time (e.g., simultaneously), without being limited thereto. In an embodiment, the method may include at the first opening OP1, providing by a first inorganic layer etching process using the first photoresist pattern PR1 as a first mask, at least one of the inorganic layers in the bending area BA which is etched.

An etching depth may be adjusted as desired. In an embodiment, the third insulation layer 140, the second insulation layer 130 and the first insulation layer 120 may be removed in the bending area BA. However, embodiments are not limited thereto. The removed inorganic layers may be varied depending on original thicknesses of the inorganic layers and the etching depth. As related to FIG. 4, for example, a thickness portion of the first insulation layer 120 may remain in the bending area BA by the etching, or a thickness portion of the buffer layer 114 may be further removed in the bending area BA. In an embodiment, for example, a sum of thicknesses of the removed inorganic layers in the bending area BA may be about 5,000 angstroms (Å) to about 15,000 Å. The sum of removed thicknesses may define an etching depth. The etching depth may be adjusted depending on an etching depth of a following second etching process.

Figure 5A:
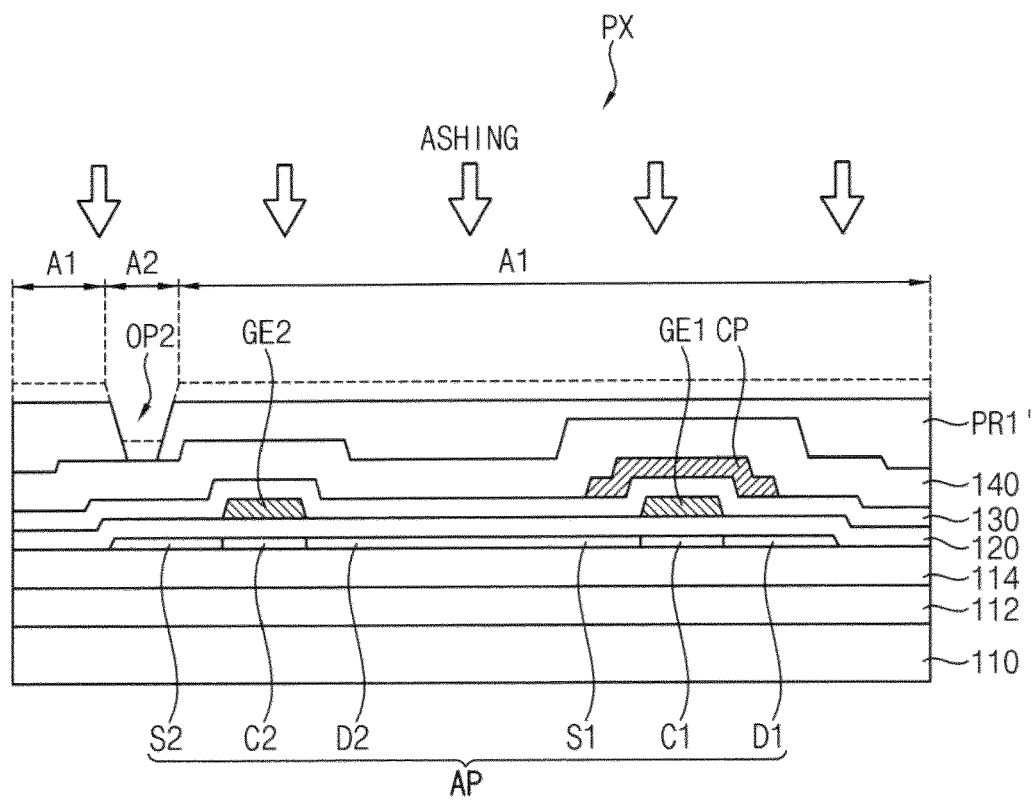
Figure 5B:
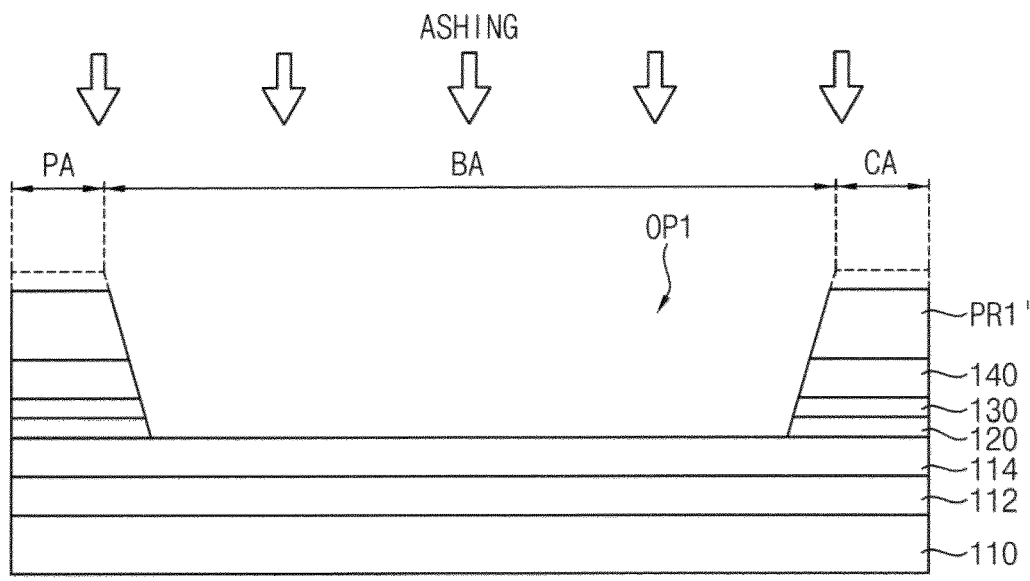

Referring to FIGS. 5A and 5B, the first photoresist pattern PR1 may be partially removed to form a remaining photoresist pattern PR1' as shown by the solid line and dotted lines. In an embodiment, for example, a thickness portion of the first photoresist pattern PR1 may be entirely reduced through an ashing process or the like. As a result, the first photoresist pattern PR1 at the second portion A2 may be entirely removed thereby providing or forming a second opening OP2 (e.g., second remaining opening) which overlaps or corresponds to a portion of the active pattern AP and exposes the third insulation layer 140 to outside the first photoresist pattern PR1. Furthermore, the remaining photoresist pattern PR1' includes a first opening OP1 (e.g., first remaining opening) having a substantially same planar shape as the first opening OP1 of the first photoresist pattern PR1.

Figure 6A:
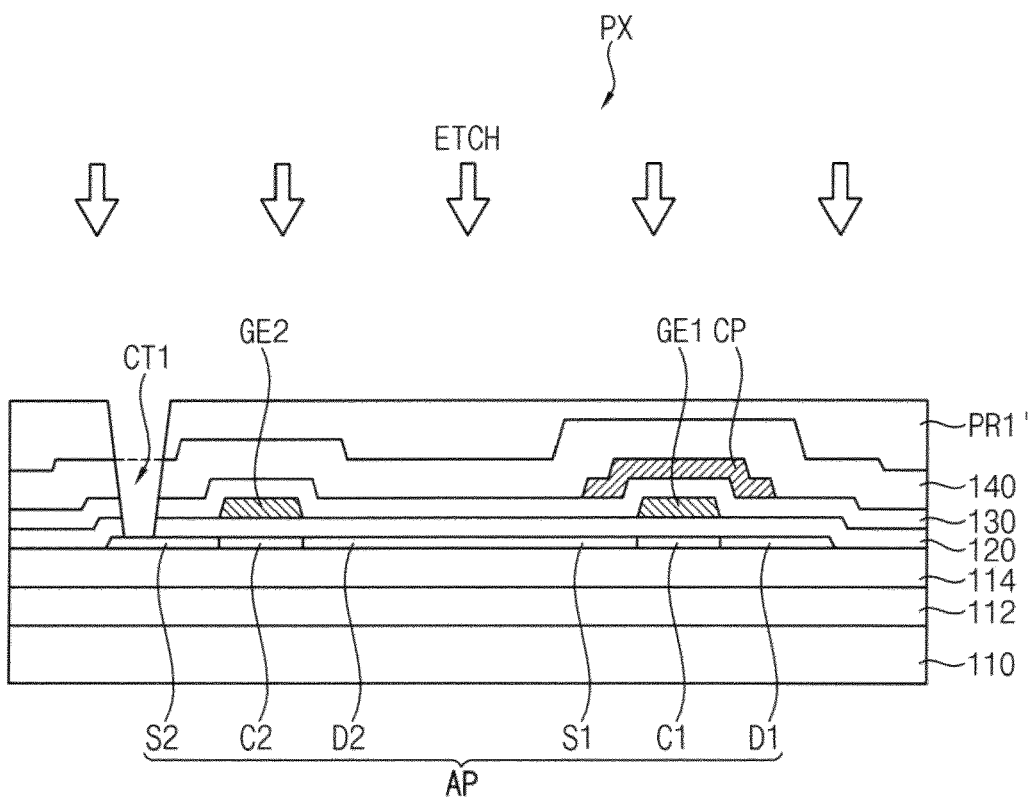
Figure 6B:
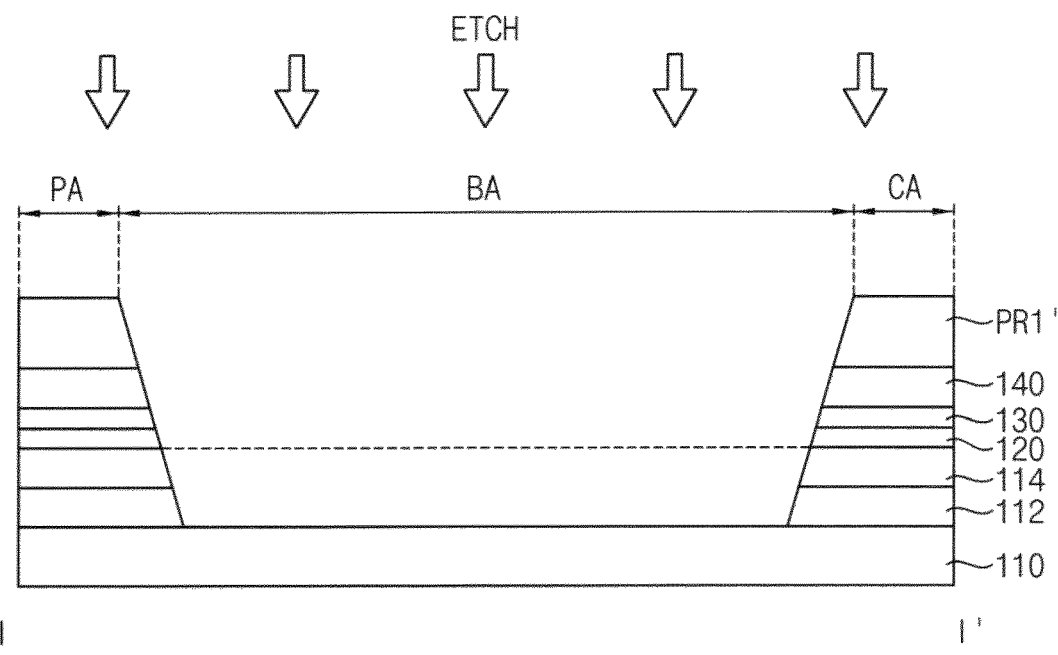

Referring to FIGS. 6A and 6B, in a second etching process (e.g., second inorganic layer etching process), the inorganic layers which are firstly etched are further etched in the bending area BA and the pixel area PX by using the remaining photoresist pattern PR1' as a remaining mask. In an embodiment, for example, the inorganic layers may be etched by a dry etching process.

In an embodiment, for example, the buffer layer 114 and the barrier layer 112 may be removed at the first opening OP1 in the bending area BA so that an upper surface of the base substrate 110 may be exposed outside of the remaining photoresist pattern PR1', the third insulation layer 140, the second insulation layer 130, the first insulation layer 120, the buffer layer 114 and the barrier layer 112. Furthermore, the third insulation layer 140, the second insulation layer 130 and the first insulation layer 120 may be removed at the second opening OP2 in the pixel area PX thereby forming a first contact hole CT1 exposing a portion of the active pattern AP to outside the third insulation layer 140, the second insulation layer 130 and the first insulation layer 120.

In an embodiment, the method may include providing by a second inorganic layer etching process using the remaining photoresist pattern PR1' as a remaining mask, both a contact hole which corresponds to the second opening OP2 and exposes the portion of the active pattern AP to outside the remaining photoresist pattern PR1', and a portion of the base substrate 110 in the bending area BA which corresponds to the first remaining opening and is exposed to outside the remaining photoresist pattern PR1'.

In an embodiment, a sum of thicknesses of the removed inorganic layers in the bending area BA in the second etching process may be less than a sum of thicknesses of the removed inorganic layers in the bending area BA in the first etching process. In an embodiment, for example, a sum of thicknesses of the removed inorganic layers in the bending area BA in the second etching process may be about 5,000 Å to about 10,000 Å. In an embodiment, the second inorganic layer etching process using the remaining photoresist pattern PR1' as the remaining mask includes removing a sum of inorganic layer thicknesses at the first remaining opening, and the first inorganic layer etching process using the first photoresist pattern PR1 as the first mask includes removing a sum of inorganic layer thicknesses at the first opening OP1 which is larger than the sum of inorganic layer thicknesses at the first remaining opening.

In an embodiment, the inorganic layers may be removed in the bending area BA by using a substantially same mask (e.g., forms of the photoresist pattern). Thus, side surfaces of the inorganic layers may be substantially continuously connected to each other at a boundary between the bending area BA and an area which is adjacent to the bending area BA (e.g., the peripheral area PA and the connection area CA). Thus, a stacked structure of the inorganic layers may form a straightly extending side surface at the boundary without a protrusion protruding in a lateral direction. The side surfaces of the inorganic layers at the bending area BA may be coplanar with each other. The side surfaces of the inorganic layers at the bending area BA may form an internal angle with respect to the base substrate 110 (e.g., a taper angle). In an embodiment, for example, a taper angle of the stacked structure including coplanar side surfaces of the inorganic layers may be about 70 degrees (°) to about 90° or about 80° to about 90°. In an embodiment, each of the inorganic barrier layer, the first inorganic insulation layer, the second inorganic insulation layer and the third inorganic insulation layer extends from the pixel area PX to define inorganic layers in the peripheral area PA. A portion of the inorganic layers in the peripheral area PA is excluded in the bending area BA to define a remaining portion the inorganic layers in the peripheral area PA. The remaining portion of the inorganic layers in the peripheral area PA defines side surfaces of the inorganic layers which are coplanar with and connected to each other at the boundary of the bending area BA which is formed with the remainder of the peripheral area PA. The side surfaces of the inorganic layers form taper angles with the base substrate 110.

Figure 7A:
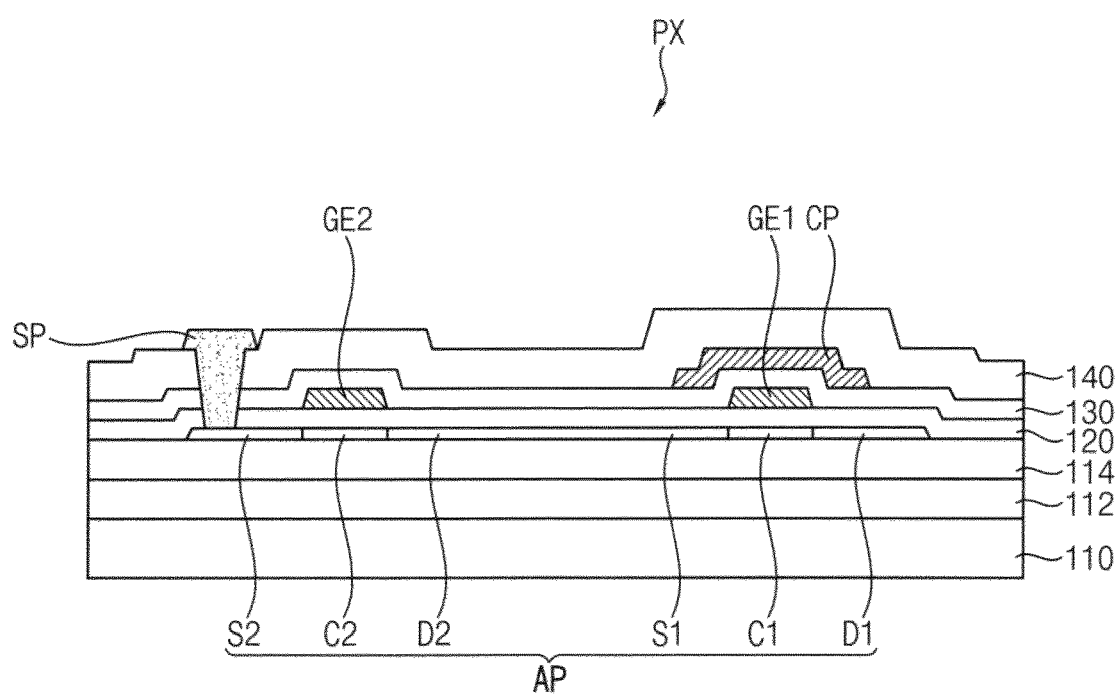
Figure 7B:
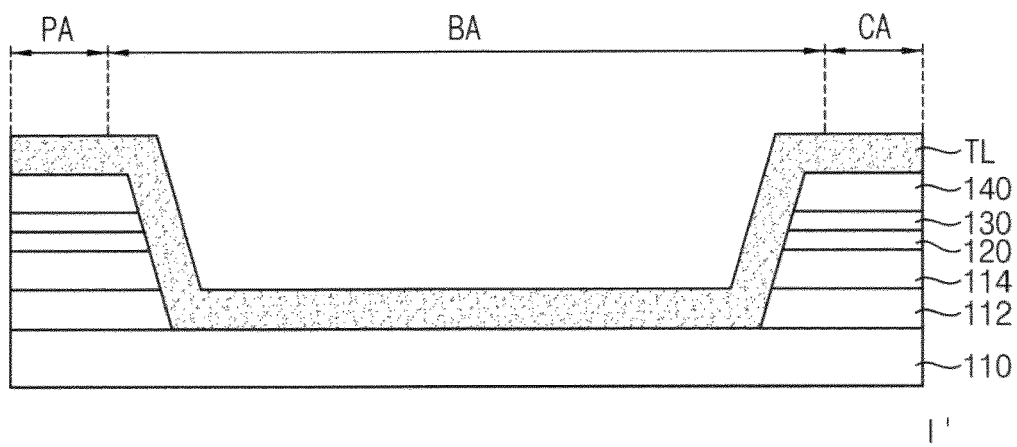

Referring to FIGS. 7A and 7B, after the remaining photoresist pattern PR1' is removed, a source metal pattern is provided or formed on the third insulation layer 140. The source metal pattern may include a source pattern SP (e.g., source electrode) and a transfer wiring TL. The source pattern SP and the transfer wiring TL may be in a same layer as each other. The source pattern SP may electrically contact the active pattern AP through the first contact hole CT1 in the pixel area PX. The transfer wiring TL may be disposed in the bending area BA. The source metal pattern may further include a drain pattern electrically contacting the drain region of the active pattern AP to transfer an electrical signal such as a driving voltage to a light-emitting diode as a light-emitting element in the pixel area PX.

In an embodiment, the source pattern SP may be a power wiring transferring a power voltage as an electrical signal. However, embodiments are not limited thereto. In an embodiment, for example, the source pattern SP may be a data line transferring a data signal as an electrical signal or a connection pattern transferring a source signal or source voltage as an electrical signal.

In an embodiment, for example, a source metal layer is provided or formed on the third insulation layer 140 and then patterned to form the source metal pattern. In an embodiment, for example, the source metal pattern may include a metal, a metal alloy, a metal nitride, a conductive metal oxide or the like. In an embodiment, for example, the source metal layer may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multiple-layered structure including different metal layers.

Figure 8A:
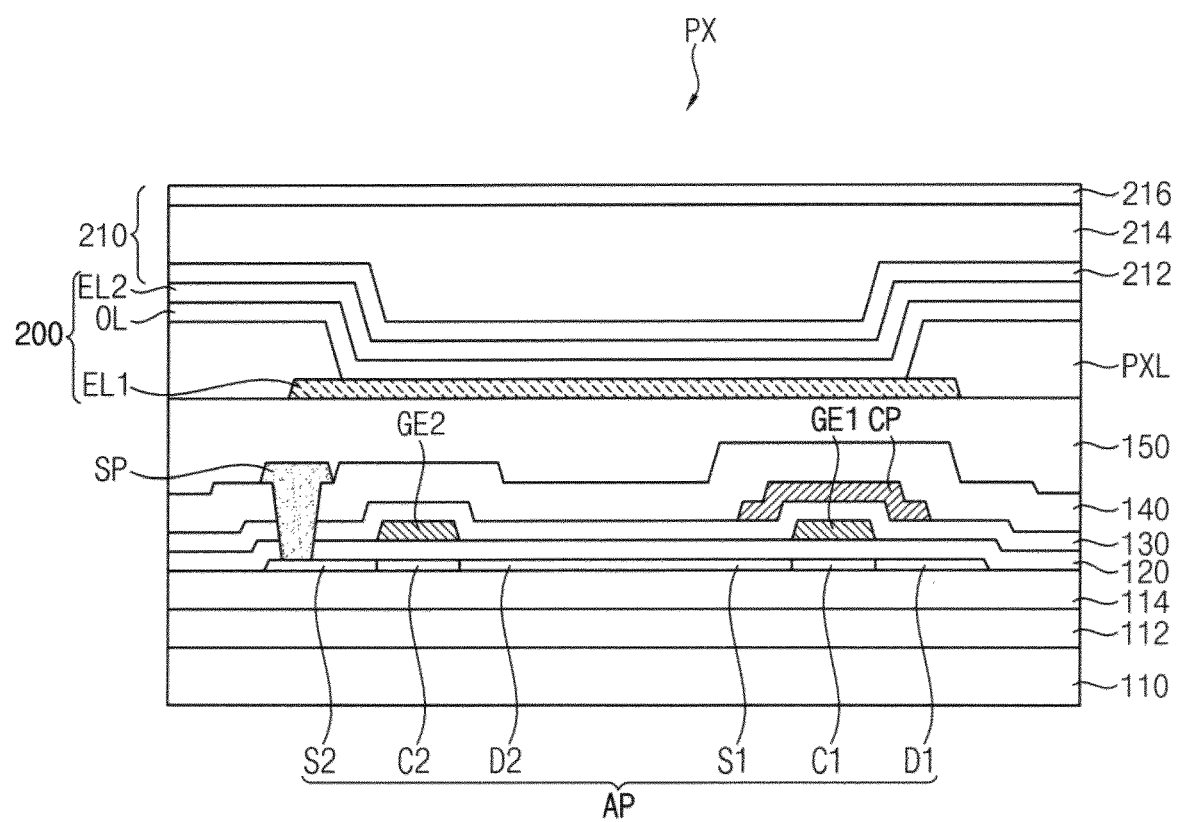

Referring to FIG. 8A, a fourth insulation layer 150 is provided or formed to cover the source metal pattern. In an embodiment, for example, the fourth insulation layer 150 may include an organic insulation material such as a phenol resin, an acryl resin, a polyimide resin, a polyamide resin, a siloxane resin, an epoxy resin or the like. The fourth insulation layer 150 may be referred to as a via insulation layer or an organic insulation layer.

A first electrode EL1 of an organic light-emitting diode 200 and a pixel-defining layer PXL may be provided or formed on the fourth insulation layer 150.

The first electrode EL1 may function as an anode of the organic light-emitting diode 200. In an embodiment, for example, the first electrode EL1 may be provided or formed as a transmitting electrode or a reflecting electrode according to an emission type of the display device 100. When the first electrode EL1 is a transmitting electrode, the first electrode EL1 may include indium tin oxide, indium zinc oxide, zinc tin oxide, indium oxide, zinc oxide, tin oxide or the like. When the first electrode EL1 is a reflecting electrode, the first electrode EL1 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including the material that may be used for the transmitting electrode.

The pixel-defining layer PXL may include or define an opening that exposes at least a portion of the first electrode EL1 to outside of the pixel-defining layer PXL. In an embodiment, for example, the pixel-defining layer PXL may include an organic insulation material.

An organic light-emitting layer OL of the organic light-emitting diode 200 is provided or formed on the first electrode ELL The organic light-emitting layer OL may include at least an emission layer, and may further include at least one of a hole injection layer ("HIL"), a hole transporting layer ("HTL"), an electron transporting layer ("ETL") and an electron injection layer ("EIL").

In an embodiment, the organic light-emitting layer OL may emit a red light, a green light or a blue light. In an embodiment, the organic light-emitting layer OL may emit a white light. The organic light-emitting layer OL emitting a white light may have a multiple-layer structure including a red-emitting layer, a green-emitting layer and a blue-emitting layer, or a single-layer structure including a combination of a red-emitting material, a green-emitting material and a blue-emitting material.

In an embodiment, for example, the organic light-emitting layer OL may be provided or formed by a screen printing method, an inkjet printing method, a vacuum deposition method or the like.

A second electrode EL2 of the organic light-emitting diode 200 is provided or formed on the organic light-emitting layer OL. In an embodiment, the second electrode EL2 may function as a cathode of the organic light-emitting diode 200. In an embodiment, for example, the second electrode EL2 may be provided or formed as a transmitting electrode or a reflecting electrode according to an emission type of the display device 100. In an embodiment, for example, when the second electrode EL2 is a reflecting electrode, the second electrode EL2 may include a metal, a metal alloy, a metal nitride, a metal fluoride, a conductive metal oxide or a combination thereof.

In an embodiment, for example, the second electrode EL2 may extend continuously across a plurality of pixel areas PX in the display area DA. In an embodiment, a capping layer and/or a blocking layer may be provided or formed on the second electrode EL2.

Thereafter, an encapsulation layer 210 may be provided or formed on the organic light-emitting diode 200. The encapsulation layer 210 may have a stacked structure of inorganic thin films 212 and 216 and an organic thin film 214.

In an embodiment, for example, the organic thin film 214 may include a cured polymer resin such as poly(meth) acrylate, an epoxy resin or the like.

In an embodiment, for example, the inorganic thin films 212 and 216 may include silicon oxide, silicon nitride, silicon oxynitride, aluminum oxide, tantalum oxide, hafnium oxide, zirconium oxide, titanium oxide or a combination thereof.

Figure 8B:
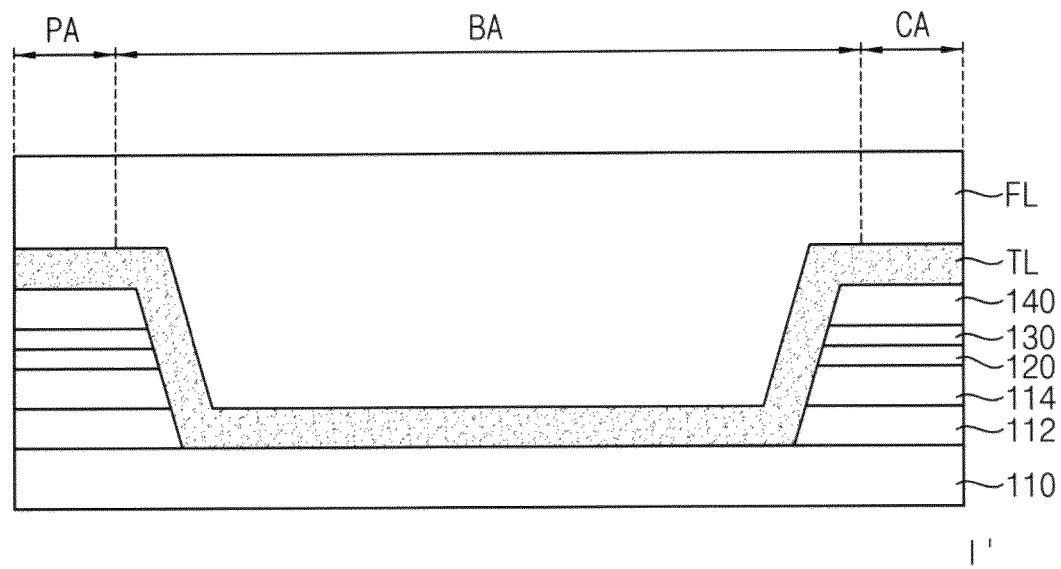

Referring to FIG. 8B, in filling of the first opening OP1, a filling member FL may be provided or formed to cover the transfer wiring TL in the bending area BA and to fill a planar area from which the inorganic layers are removed. In an embodiment, for example, the filling member FL may be provided or formed in the process of providing or forming the fourth insulation layer 150 so that the filling member FL may include a same material as the fourth insulation layer 150. The fourth insulation layer 150 and the filling member FL may be in a same layer as each other. In an embodiment, at least a portion of the filling member FL may be provided or formed in the process of providing or forming the pixel-defining layer PXL so that the at least a portion of the filling member FL may include a same material as the pixel-defining layer PXL. That is, the filling member FL may be in a same layer as the pixel-defining layer PXL.

Figure 8C:
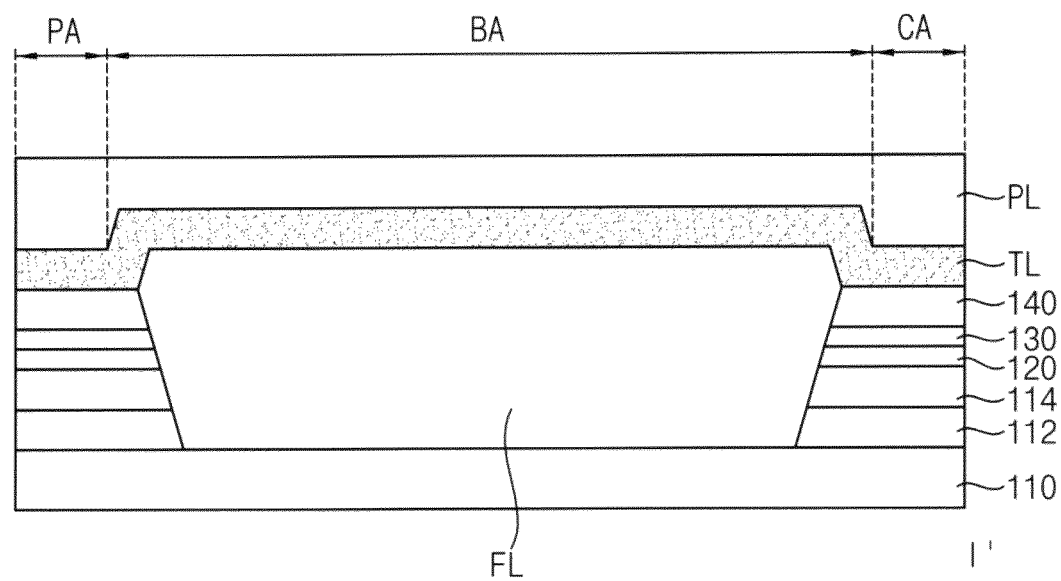

In an embodiment, as illustrated in FIG. 8C, a filling member FL including an organic material may be disposed under a transfer wiring TL to fill the first opening OP1. A protective layer PL may be further provided or formed to cover the transfer wiring TL. In an embodiment, for example, the filling member FL may be provided formed in an individual process, which is different from each of the processes of providing or forming the fourth insulation layer 150 and the pixel-defining layer PXL. The protective layer PL may be provided or formed in the process of providing forming the fourth insulation layer 150 or the pixel-defining layer PXL.

In an embodiment, thickness portions of inorganic layers disposed in a pixel area PX and in a bending area BA may be removed simultaneously such as through a same photolithography process. Thus, an additional photolithography process for individually etching the inorganic layers in the bending area BA may be omitted.

Furthermore, since a stacked structure of the inorganic layers may define a coplanar side surfaces at a boundary between the bending area BA and an area which is adjacent to the bending area BA without a protrusion protruding in a lateral direction, a size of a peripheral area PA (e.g., a non-display area) may be substantially reduced.

FIGS. 9A, 9B, 10A, 10B, 11A, 11B, 12A, 12B, 13A, 13B, 14A, 14B, 14C, 15A and 15B are cross-sectional views illustrating an embodiment of a method for providing or manufacturing a display device 100. FIGS. 9A, 10A, 11A, 12A, 13A, 14A and 15A may show enlarged cross-sectional areas of a pixel area PX of a display area DA, and FIGS. 9B, 10B, 11B, 12B, 13B, 14B, 14C and 15B may show enlarged cross-sectional areas of a bending area BA and areas adjacent thereto.

Figure 9A:
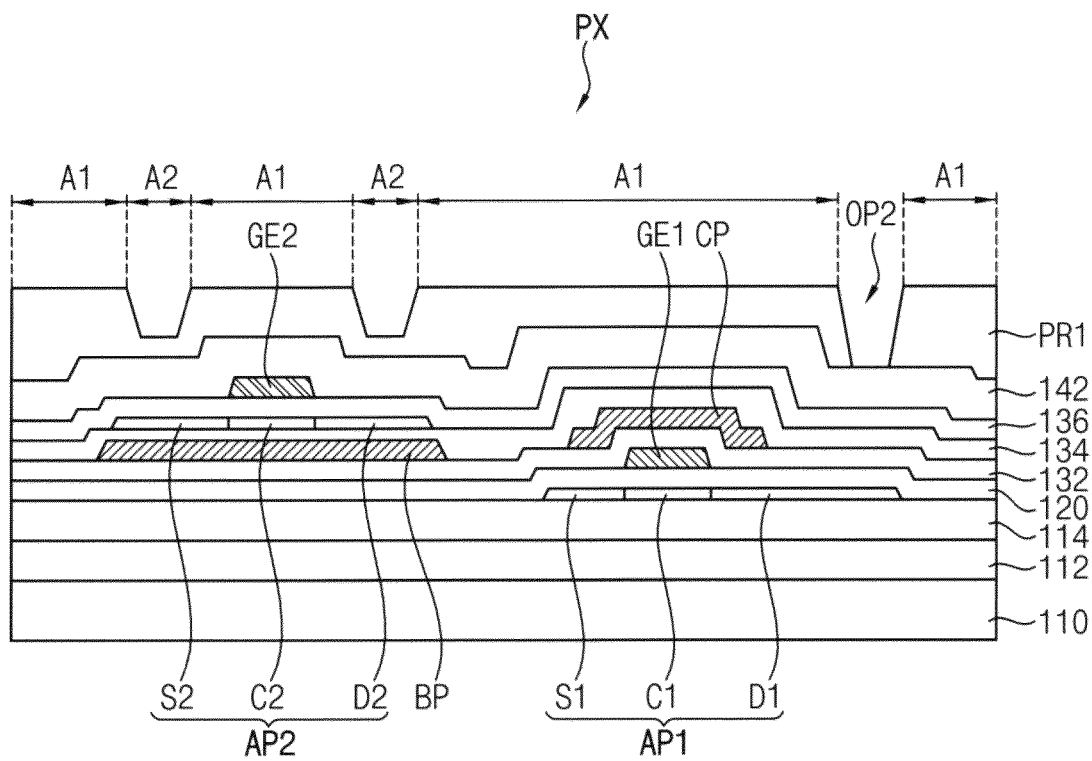
FIGS. 9A, 9B, 10A, 10B, 11A, 11B, 12A, 12B, 13A, 13B, 14A, 14B, 14C, 15A and 15B are cross-sectional views illustrating an embodiment of a method for providing or manufacturing a display device.
Figure 9B:
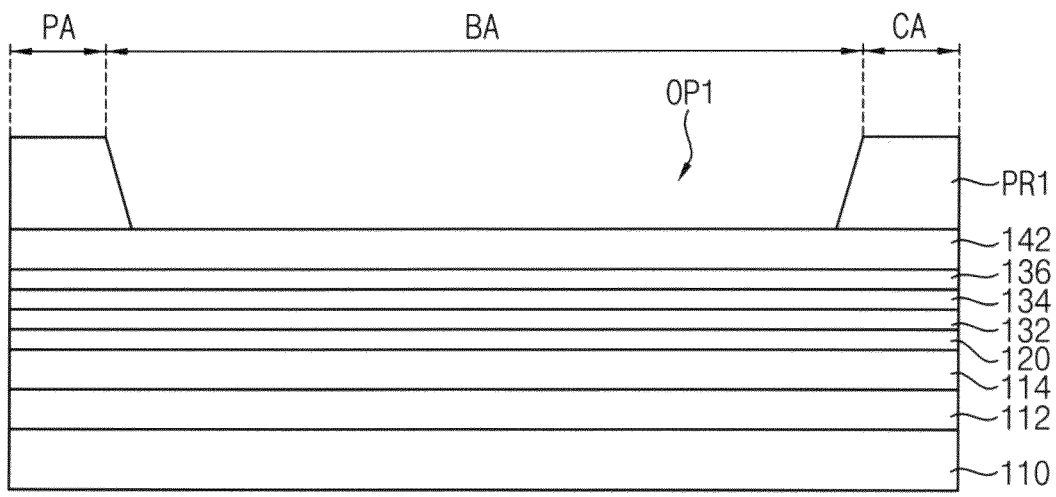

Referring to FIGS. 9A and 9B, a barrier layer 112 and a buffer layer 114 are provided or formed on a base substrate 110.

A first active pattern AP1 and a first insulation layer 120 which covers the first active pattern AP1 are provided or formed on the buffer layer 114. A first gate metal pattern including a first gate electrode GE1 is provided or formed on the first insulation layer 120. In an embodiment, the first active pattern AP1 may include a multi-crystalline silicon (polysilicon).

In an embodiment, for example, the first active pattern AP1 may include a first channel region C1 overlapping the first gate electrode GE1, a first source region S1 and a first drain region D1. The first source region S1 and the first drain region D1 are adjacent to the first channel region C1 at opposing sides thereof, respectively.

In an embodiment, a first gate metal layer is provided or formed on the first insulation layer 120 and then patterned to form the first gate metal pattern including the first gate electrode GE1. A second insulation layer 132 is provided or formed on the first gate metal pattern. A second gate metal layer is provided or formed on the second insulation layer 132 and then patterned to form a second gate metal pattern including a capacitor pattern CP.

The second gate metal pattern may further include a bottom gate pattern BP. The capacitor pattern CP and the bottom gate pattern BP may be in a same layer. The bottom gate pattern BP may overlap a second channel region C2 of a second active pattern AP2 disposed on the bottom gate pattern BP. The bottom gate pattern BP may block a light entering from a lower surface of the second channel region C2 to reduce or effectively prevent deterioration of characteristics of a driving element including the second channel region C2. In an embodiment, for example, a same electrical signal as a gate signal applied to a second gate electrode GE2 may be applied to the bottom gate pattern BP.

A third insulation layer 134 is provided or formed on the second gate metal pattern. The second active pattern AP2 is provided or formed on the third insulation layer 134. A fourth insulation layer 136 is provided or formed to cover the second active pattern AP2. A third gate metal pattern is provided or formed on the fourth insulation layer 136. A fifth insulation layer 142 is provided or formed to cover the third gate metal pattern.

The second active pattern AP2 includes a metal oxide semiconductor. In an embodiment, for example, the second active pattern AP2 may include two-component compound (ABx), ternary compound (ABxCy) or four-component compound (ABxCyDz), which contains indium (In), zinc (Zn), gallium (Ga), tin (Sn), titanium (Ti), aluminum (Al), hafnium (Hf), zirconium (Zr), magnesium (Mg). For example, the second active pattern AP2 may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), or the like.

The third gate metal pattern may include the second gate electrode GE2 overlapping or corresponding to the second channel region C2 of the second active pattern AP2. The third gate metal pattern may include a substantially same material as the first gate metal pattern or the second gate metal pattern.

In an embodiment, for example, an oxide semiconductor pattern may be provided or formed on the third insulation layer 134. The fourth insulation layer 136 may be provided or formed to cover the oxide semiconductor pattern. The third gate metal pattern including the second gate electrode GE2, which partially overlaps the oxide semiconductor pattern, may be provided or formed on the fourth insulation layer 136. The oxide semiconductor pattern may be partially doped by using the second gate electrode GE2 or a photoresist pattern on the second gate electrode GE2 as a mask thereby providing or forming a second source region S2 and a second drain region D2.

The first insulation layer 120, the second insulation layer 132, the third insulation layer 134, the fourth insulation layer 136 and the fifth insulation layer 142 may each include an inorganic material, and may have a single-layered structure or a multiple-layered structure. In an embodiment, for example, the first insulation layer 120, the second insulation layer 132, the third insulation layer 134, the fourth insulation layer 136 and the fifth insulation layer 142 may each include silicon oxide, silicon nitride, silicon oxynitride or a combination thereof. Furthermore, the first insulation layer 120, the second insulation layer 132, the third insulation layer 134, the fourth insulation layer 136 and the fifth insulation layer 142 may each include an insulating metal oxide such as aluminum oxide, tantalum oxide, hafnium oxide, zirconium oxide, titanium oxide or a combination thereof.

In an embodiment, the first insulation layer 120 may include silicon oxide. The second insulation layer 132 may include silicon nitride, and the third insulation layer 134 may include a lower layer including silicon nitride and an upper layer including silicon oxide. The fourth insulation layer 136 may include silicon oxide, and the fifth insulation layer 142 may include a lower layer including silicon oxide and an upper layer including silicon nitride.

A first photoresist pattern PR1 is provided or formed on the fifth insulation layer 142. Referring to FIG. 9A, the first photoresist pattern PR1 may include a first portion A1 and a second portion A2 which have different thicknesses and are disposed in the pixel area PX. In an embodiment, for example, the second portion A2 may overlap or correspond to a portion of the second active pattern AP2, and a height of an upper surface of the first photoresist pattern PR1 at the second portion A2 from a reference such as the upper surface of the base substrate 110 may be smaller than a height of an upper surface of the first photoresist pattern PR1 at the first portion A1. Furthermore, the first photoresist pattern PR1 may include or define a second opening OP2 which overlaps or corresponds to a portion of the first active pattern AP1 in the pixel area PX.

Referring to FIG. 9B, the barrier layer 112, the buffer layer 114, the first insulation layer 120, the second insulation layer 132, the third insulation layer 134, the fourth insulation layer 136 and the fifth insulation layer 142 may each extend from the pixel area PX to define a respective extended portion which is disposed in the bending area BA.

A solid portion of the first photoresist pattern PR1 may not be disposed in the bending area BA. In an embodiment, for example, the first photoresist pattern PR1 may include or define a first opening OP1 overlapping the bending area BA. Thus, an upper surface of the fifth insulation layer 142 may be exposed to outside the first photoresist pattern PR1 at the bending area BA.

The first photoresist pattern PR1 having different thicknesses may be provided or formed by using half-tone light-exposure.

In an embodiment, the barrier layer 112, the buffer layer 114, the first insulation layer 120, the second insulation layer 132, the third insulation layer 134, the fourth insulation layer 136 and the fifth insulation layer 142 may be referred to as a first inorganic layer, a second inorganic layer, a third inorganic layer, a fourth inorganic layer, a fifth inorganic layer, a sixth inorganic layer and a seventh inorganic layer, respectively, or inorganic layers collectively.

Figure 10A:
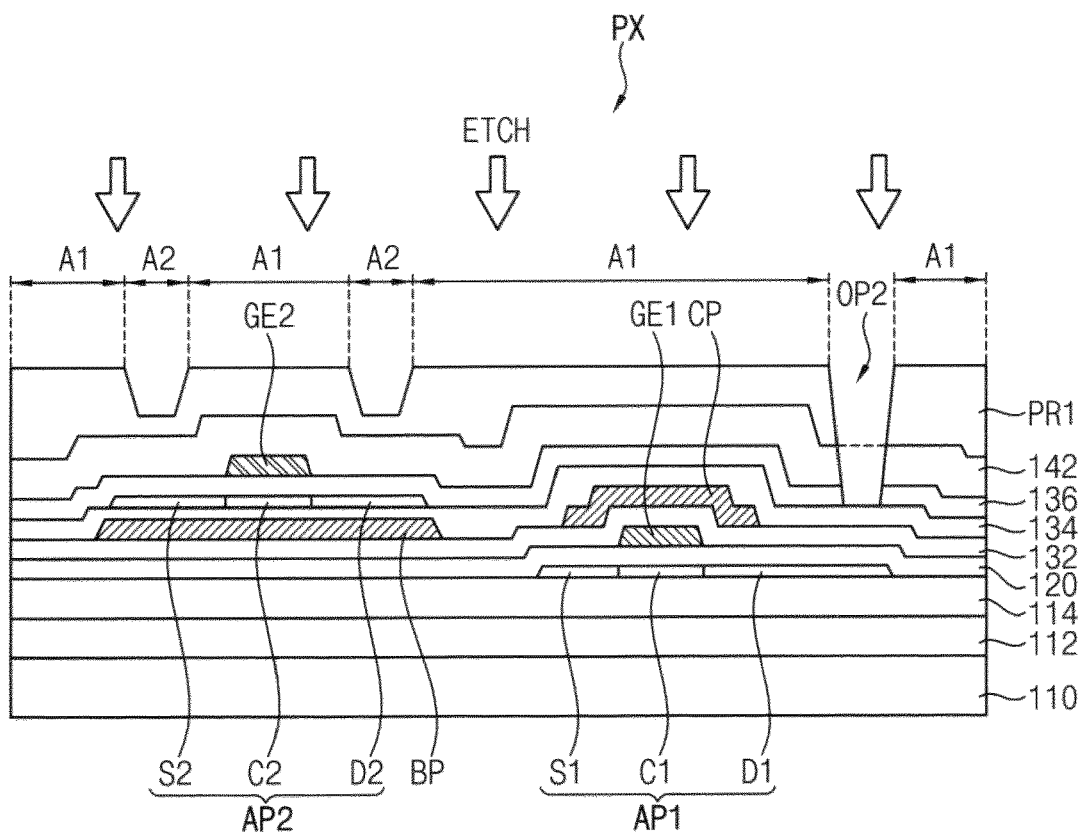
Figure 10B:
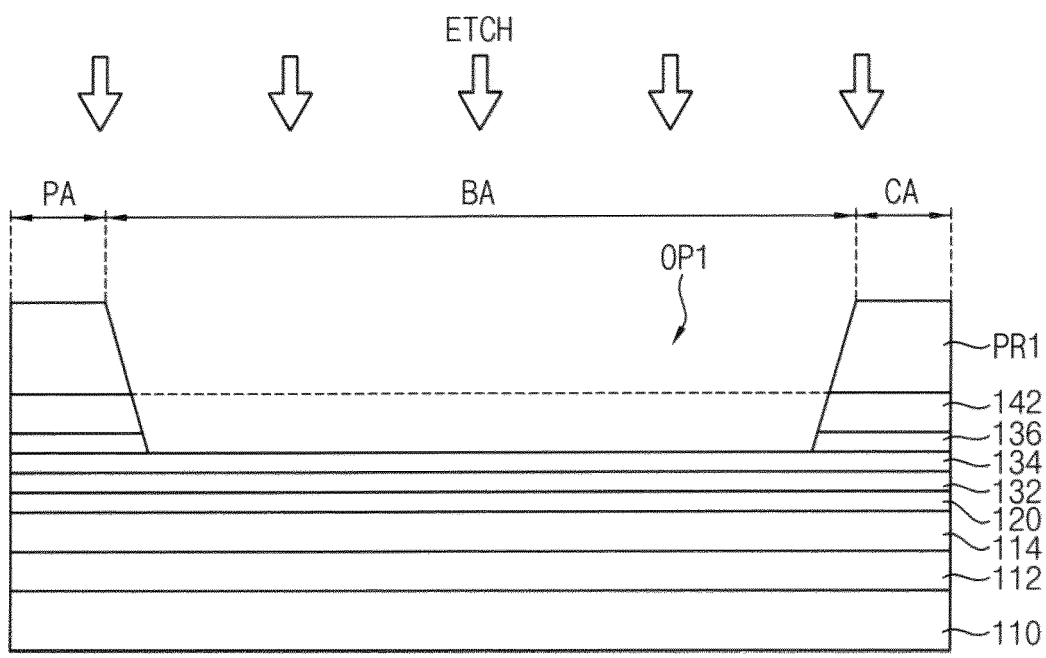

Referring to FIGS. 10A and 10B, in a first etching process, the inorganic layers are etched in the bending area BA at the first opening OP1 and in the pixel area PX at the second opening OP2 by using the first photoresist pattern PR1 as a first mask. In an embodiment, for example, the inorganic layers may be etched by a dry etching process.

An etching depth may be adjusted as desired. In an embodiment, thickness portions of the fifth insulation layer 142 and the fourth insulation layer 136 may be removed in the bending area BA at the first opening OP1 and in the pixel area PX at the second opening OP2. In an embodiment, the first inorganic layer etching process using the first photoresist pattern PR1 as the first mask may further provide both at the first opening OP1, the bending area BA excluding the seventh inorganic layer and the sixth inorganic layer, and the seventh inorganic layer and the sixth inorganic layer excluded at the second opening OP2. However, embodiments are not limited thereto.

The removed thickness portions of the inorganic layers may be varied depending on original thicknesses of the inorganic layers and/or the etching depth. As related to FIGS. 10A and 10B, for example, a thickness portion of the fourth insulation layer 136 may remain in the bending area BA and in the pixel area PX instead of being completely removed, or a thickness portion of the third insulation layer 134 may be further removed in the bending area BA and in the pixel area PX. In an embodiment, for example, a sum of thicknesses of the removed portions of the inorganic layers in the above first etching process may be about 4,000 Å to about 10,000 Å. The etching depth may be adjusted depending on an etching depth of a following second etching process.

Figure 11A:
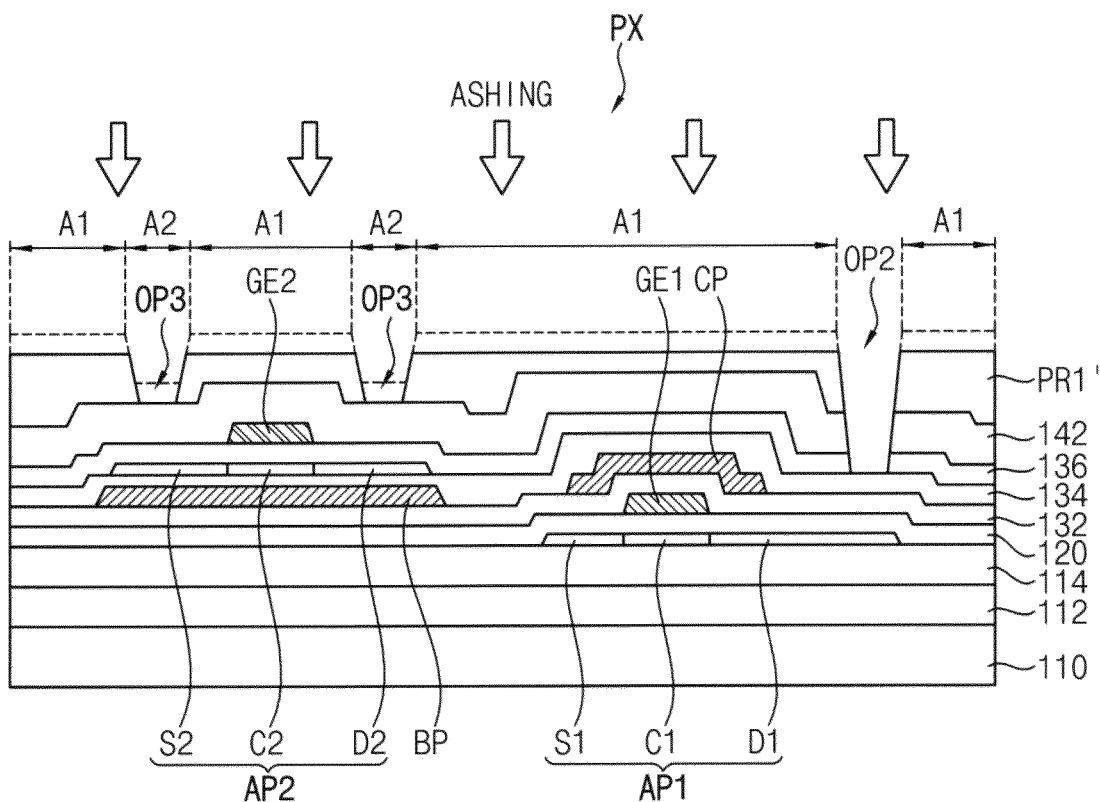
Figure 11B:
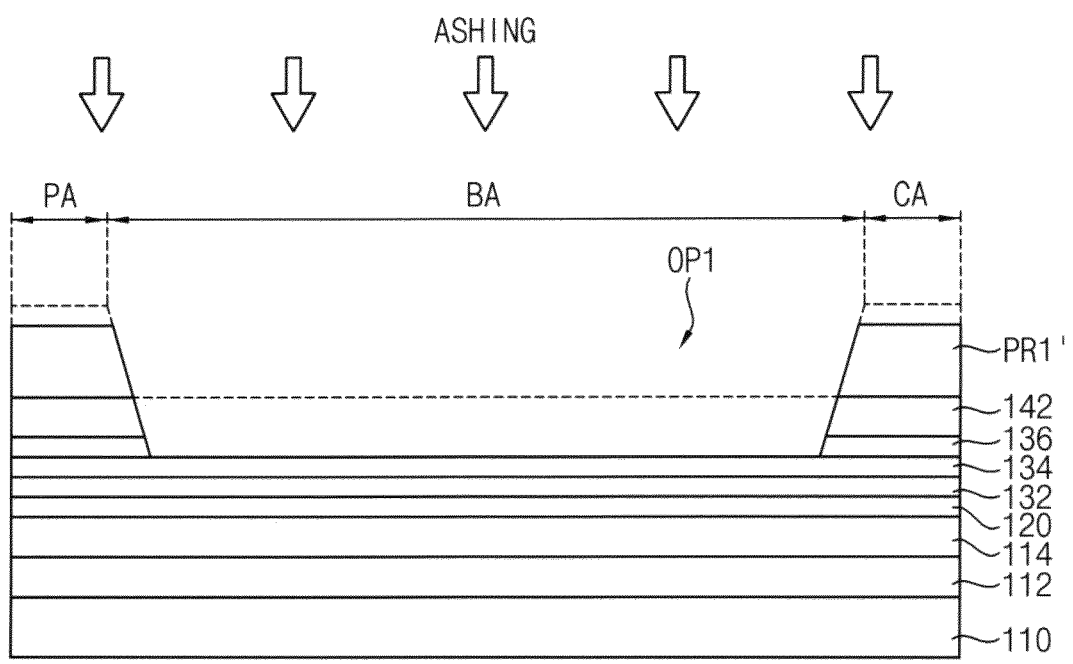

Referring to FIGS. 11A and 11B, the first photoresist pattern PR1 may be partially removed to form a remaining photoresist pattern PR1'. In an embodiment, for example, a thickness portion of the first photoresist pattern PR1 may be entirely reduced through an ashing process or the like. As a result, the first photoresist pattern PR1 at the second portion A2 may be entirely removed thereby providing or forming a third opening OP3, which overlaps a portion of the second active pattern AP2 and exposes the fifth insulation layer 142 to outside the remaining photoresist pattern PR1'. The remaining photoresist pattern PR1' may include or define a first opening OP1 and a second opening OP2, which have a substantially same planar shape as the first opening OP1 and the second opening OP2 of the first photoresist pattern PR1. In an embodiment, the remaining photoresist pattern PR1' may define a first remaining opening corresponding to the first opening OP1 in the bending area BA, a second remaining opening corresponding to the second opening OP2 in the pixel area PX, and a third opening OP3 which corresponds to a portion of the second active pattern AP2 in the pixel area PX and extends to the inorganic layers in the pixel area PX.

Figure 12A:
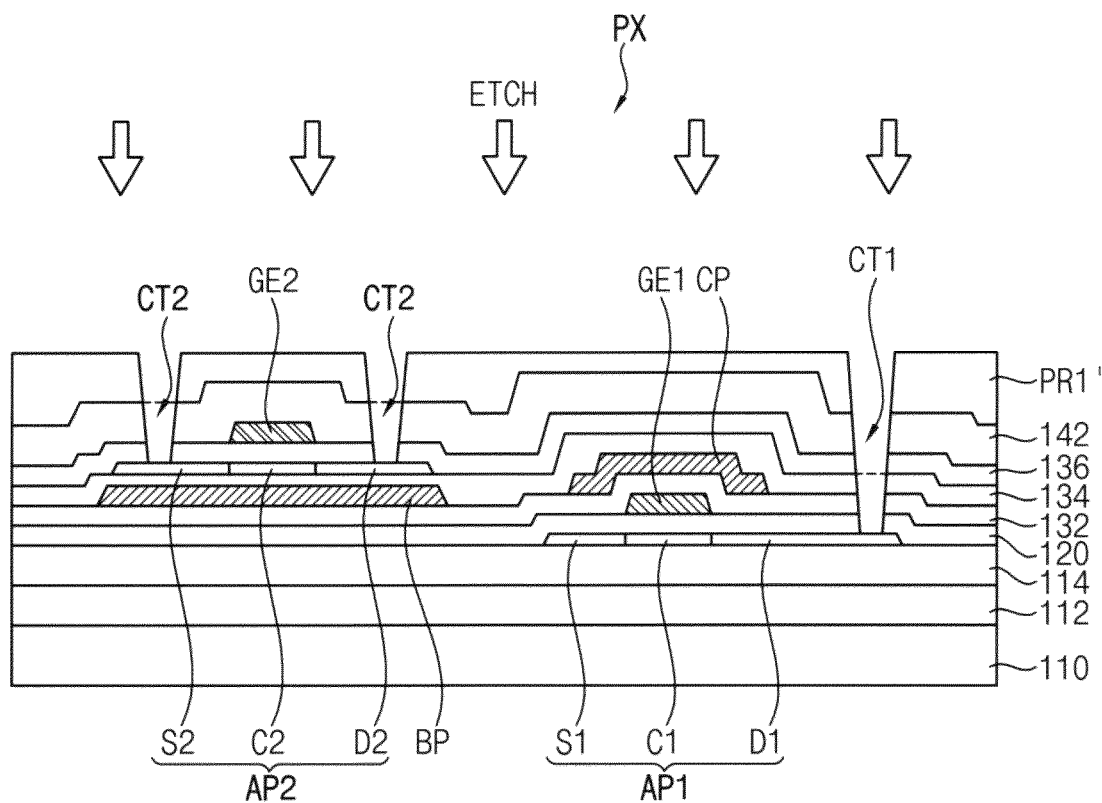
Figure 12B:
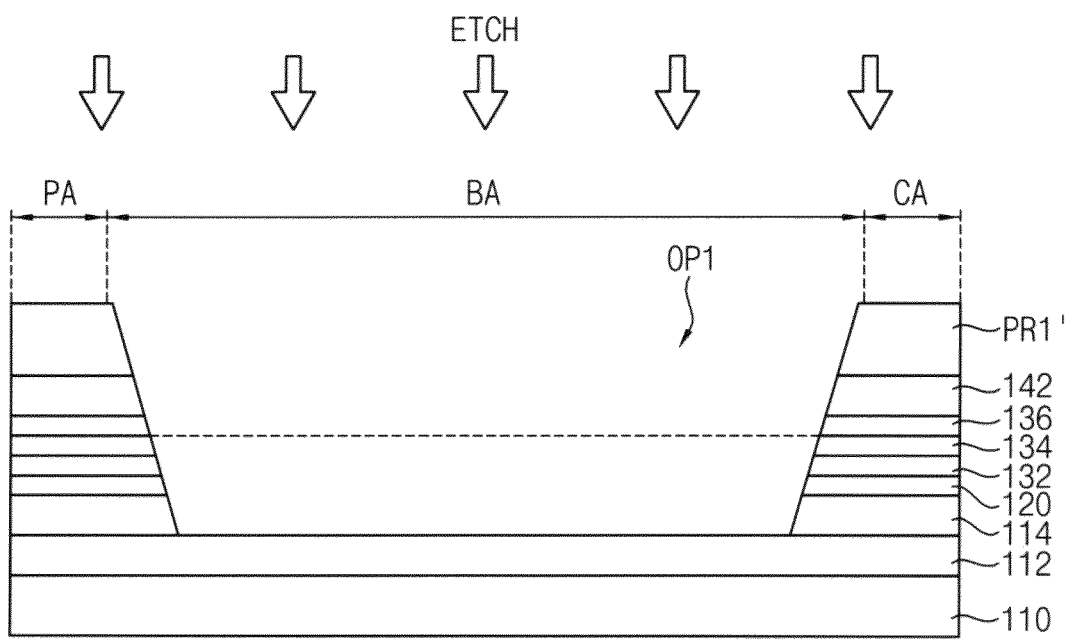

Referring to FIGS. 12A and 12B, in a second etching process, the inorganic layers which are first etched are further etched at the first opening OP1, the second opening OP2 and the third opening OP3 in the bending area BA and in the pixel area PX by using the remaining photoresist pattern PR1' as a remaining mask. In an embodiment, for example, the inorganic layers may be etched by a dry etching process.

In an embodiment, for example, the third insulation layer 134, the second insulation layer 132 and the first insulation layer 120 may be completely removed in the bending area BA at the first opening OP1, and at least a portion of the buffer layer 114 may be further removed. However, embodiments are not limited thereto. In an embodiment, for example, an etching depth may be increased to further remove at least a portion of the barrier layer 112.

Furthermore, the third insulation layer 134, the second insulation layer 132 and the first insulation layer 120 may be removed in the pixel area PX at the second opening OP2 to form a first contact hole CT1 exposing a portion of the first active pattern AP1 to outside the remaining photoresist pattern PR1', the fifth insulation layer 142, the fourth insulation layer 136, the third insulation layer 134, the second insulation layer 132 and the first insulation layer 120.

Furthermore, the fifth insulation layer 142 and the fourth insulation layer 136 may be removed in the pixel area PX at the third opening OP3 to form a second contact hole CT2 exposing a portion of the second active pattern AP2 to outside the remaining photoresist pattern PR1', the fifth insulation layer 142 and the fourth insulation layer 136. In an embodiment, the method may further include providing by a second inorganic layer etching process using the remaining photoresist pattern PR1' as a remaining mask, each of at least one of the inorganic layers at the first remaining opening which is etched to define remaining inorganic layers in the bending area BA, a first contact hole CT1 which corresponds to the second opening OP2 and exposes the first active pattern AP1 to outside the remaining photoresist pattern PR1', and a second contact hole CT2 which corresponds to the third opening OP3 and exposes the second active pattern AP2 to outside the remaining photoresist pattern PR1'.

Figure 13A:
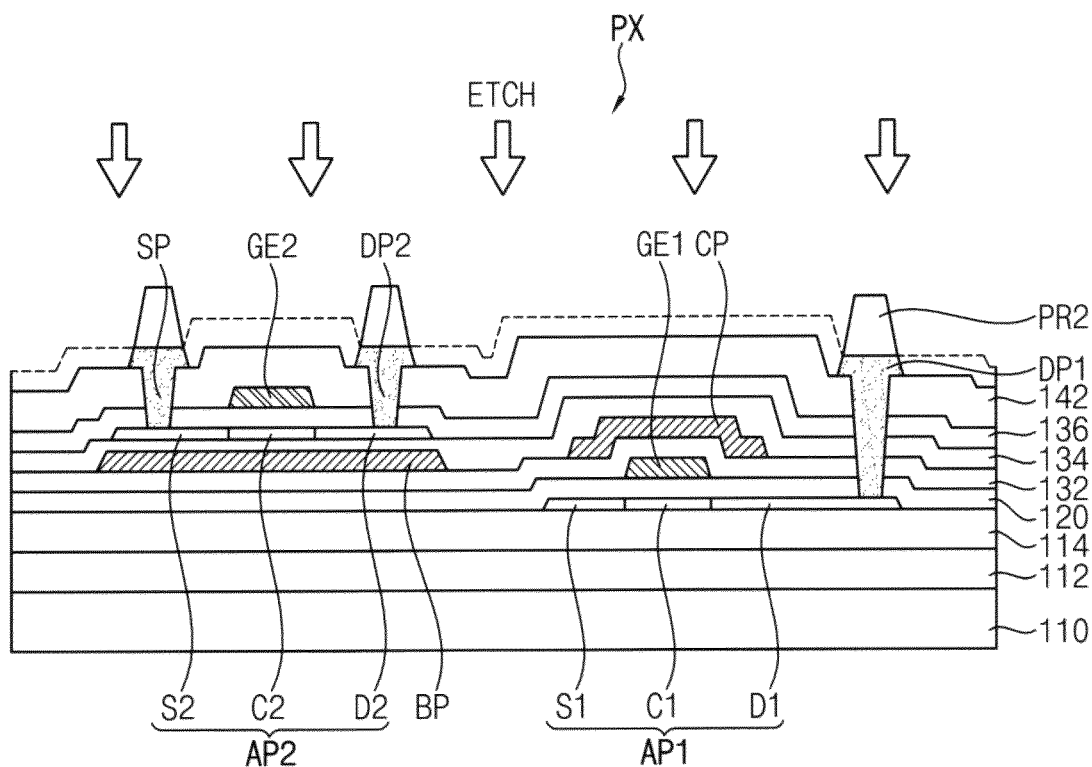
Figure 13B:
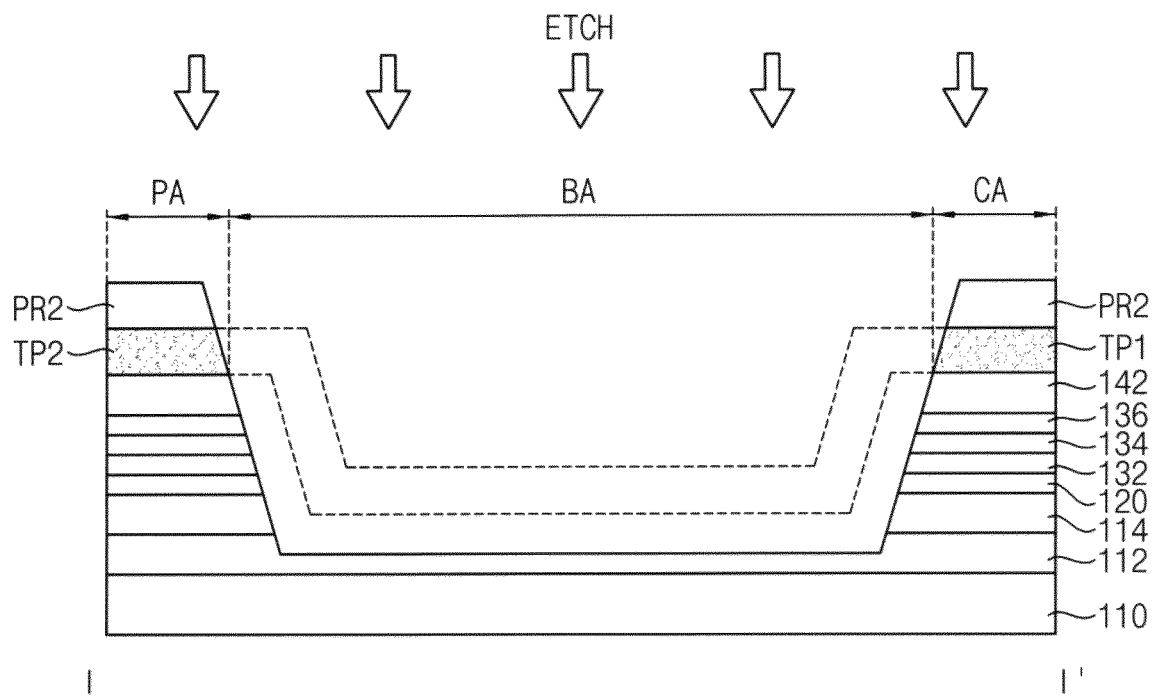

Referring to FIGS. 13A and 13B, after the remaining photoresist pattern PR1' is removed, a first source metal pattern is provided or formed on the fifth insulation layer 142.

The first source metal pattern may include a first drain pattern DP1 (e.g., first drain electrode), a source pattern SP and a second drain pattern DP2 (e.g., second drain electrode). The first drain pattern DP1 may electrically contact the first active pattern AP1 at or through the first contact hole in the pixel area PX. The source pattern SP and the second drain pattern DP2 may electrically contact the second active pattern AP2 at or through the second contact hole CT2 in the pixel area PX.

In an embodiment, for example, the first drain pattern DP1 may electrically contact the first drain region D1 of the first active pattern AP1 to transfer a driving voltage to a light-emitting diode. In an embodiment, for example, the source pattern SP may transfer a source signal such as an initialization voltage as an electrical signal. In an embodiment, for example, the second drain pattern DP2 may be electrically connected to the first gate electrode GE1 or the first drain region D1.

The first source metal pattern may further include a first transfer pattern TP1 and a second transfer pattern TP2. The first transfer pattern TP1 may be disposed in a connection area CA. The second transfer pattern TP2 may be disposed in a peripheral area PA. The first transfer pattern TP1 in the connection area CA may transfer a driving signal or a power voltage as an electrical signal to a transfer wiring TL provided or formed in the bending area BA. The second transfer pattern TP2 in the peripheral area PA may transfer a driving signal or a power voltage as an electrical signal from the transfer wiring TL in the bending area BA to the pixel area PX in the display area DA.

In an embodiment, for example, a first source metal layer is provided or formed on the fifth insulation layer 142. A second photoresist pattern PR2 is provided or formed on the first source metal layer. The second photoresist pattern PR2 may have a planar shape corresponding to the first source metal pattern. Thus, the second photoresist pattern PR2 may not be disposed in (e.g., is excluded from) the bending area BA.

The first source metal layer is etched by using the second photoresist pattern PR2 as a second mask to provide or form the first source metal pattern. In an embodiment, the first source metal layer may be etched by a dry etching process. The first drain pattern DP1, the source pattern SP, the second drain pattern DP2, the first transfer pattern TP1 and the second transfer pattern TP2 may be in a same layer as each other.

Referring to FIG. 13B, when the first source metal layer is etched, the inorganic layers remaining in the bending area BA may be further etched. In an embodiment, for example, after the first source metal layer is removed in the bending area BA, at least a portion of the thickness of the barrier layer 112 may be removed by over-etching. The over-etching (time) may be increased to entirely remove the barrier layer 112 in the bending area BA. However, the over-etching is performed such that damage of the fifth insulation layer 142 in the pixel area PX is prevented or minimized. In an embodiment, for example, an etching depth of the inorganic layers by the over-etching may be about 1,000 Å to about 3,000 Å.

Figure 14A:
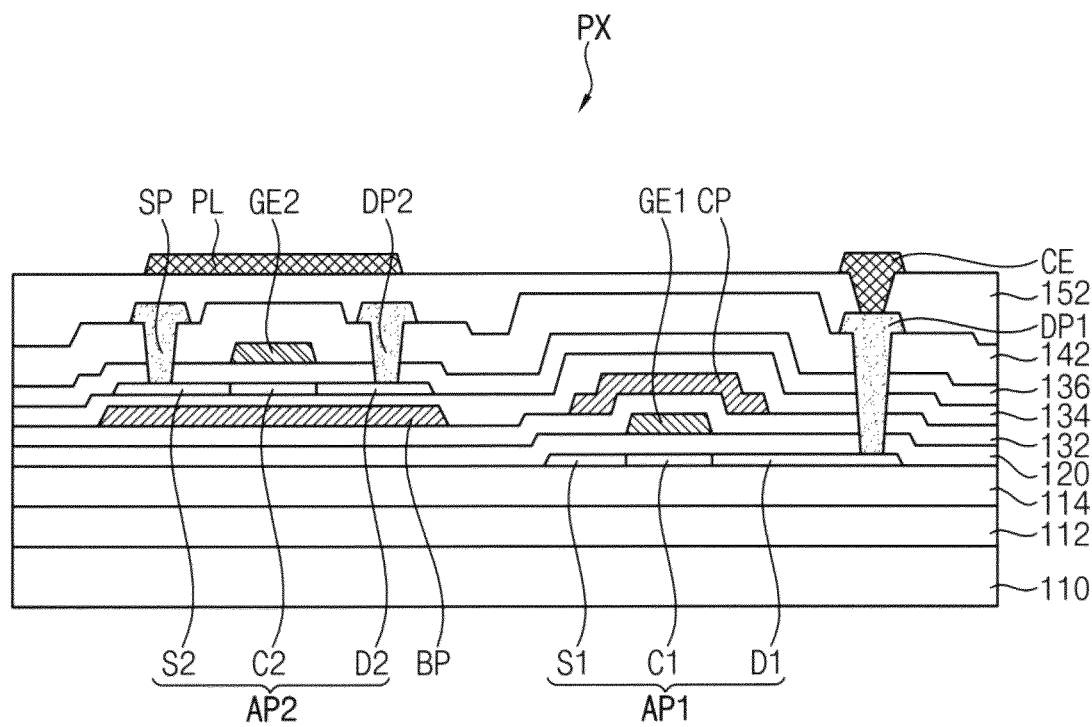
Figure 14B:
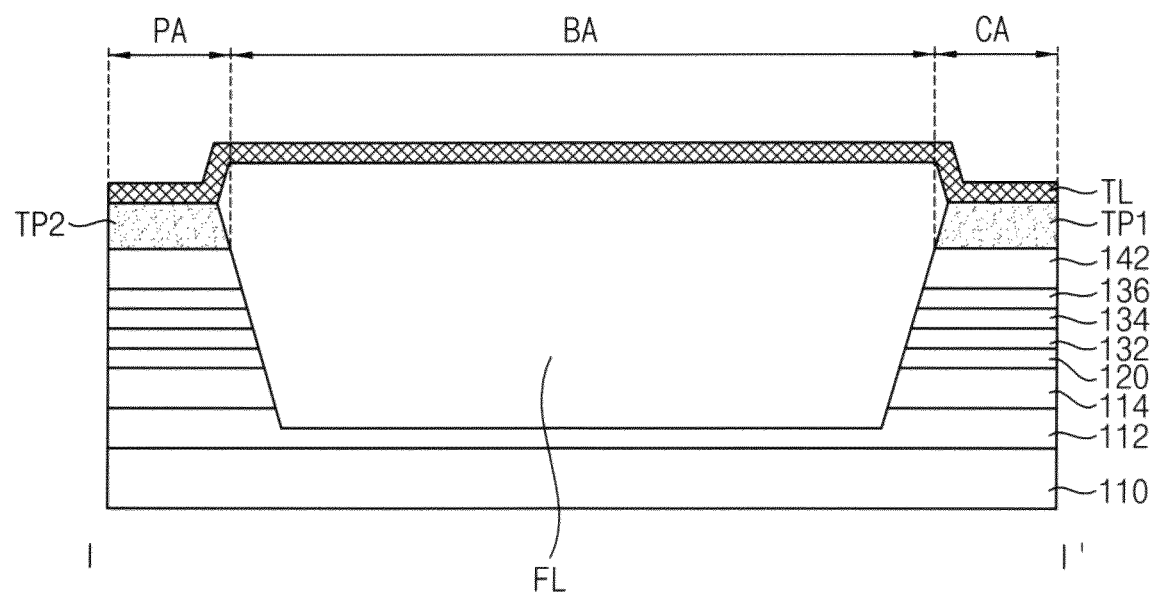

Referring to FIGS. 14A and 14B, the second photoresist pattern PR2 is removed, and a sixth insulation layer 152 is provided or formed to cover the first source metal pattern. The sixth insulation layer 152 may include an organic insulation material such as a phenol resin, an acryl resin, a polyimide resin, a polyamide resin, a siloxane resin, an epoxy resin or the like. The sixth insulation layer 152 may be referred to as a first via insulation layer or a first organic insulation layer.

A filling member FL may be provided or formed in the bending area BA to fill an area where the inorganic layers are removed. In an embodiment, the first organic insulation layer may define the filling member FL which fills an entirety of an area from which the portion of the remaining inorganic layers is removed in the bending area BA. The filling member FL may include an organic material. In an embodiment, for example, the filling member FL may be provided or formed in the process of providing or forming the sixth insulation layer 152 so that the filling member FL may include a same material as the sixth insulation layer 152. The sixth insulation layer 152 and the filling member FL may be in a same layer as each other.

A second source metal pattern is provided or formed on the sixth insulation layer 152. In an embodiment, for example, the second source metal pattern may include a connection electrode CE electrically contacting the first drain pattern DP1 at a contact hole in the sixth insulation layer 152. Furthermore, the second source metal pattern may further include a power wiring PW which transfers a power voltage as an electrical signal. In an embodiment, for example, the second source metal pattern may include a same material as the first source metal pattern.

Referring to FIG. 14B, the second source metal pattern may further include a transfer wiring TL disposed in the bending area BA. The transfer wiring TL may be disposed on the filling member FL, and may be electrically connected to the transfer patterns TP1 and TP2 respectively disposed in the connection area CA and the peripheral area PA.

Figure 14C:
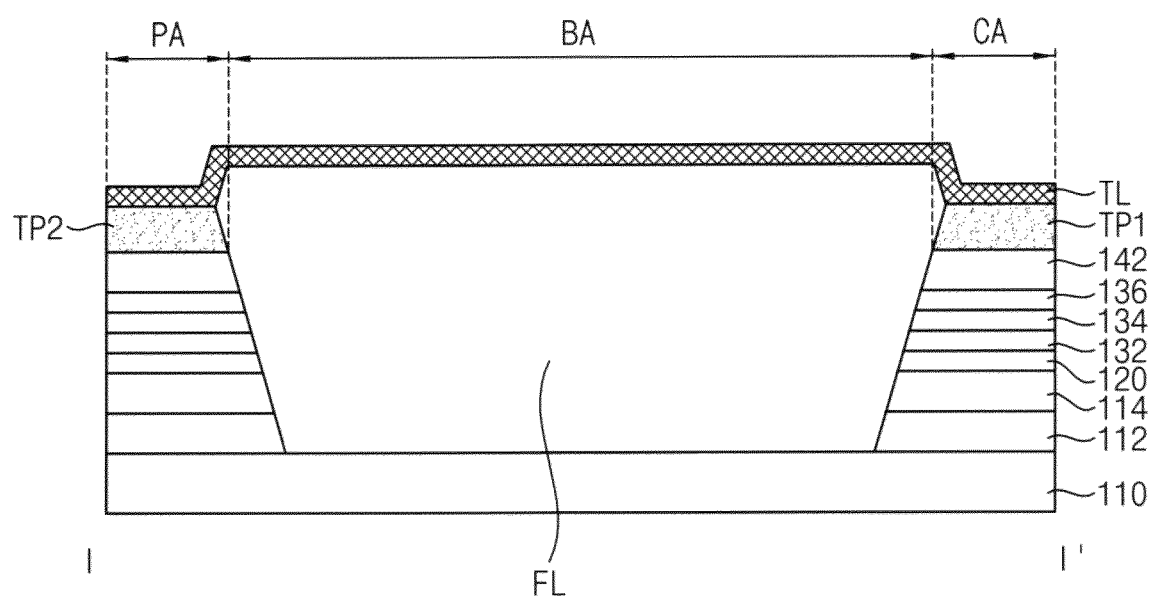

Referring to FIG. 14B, a portion of the barrier layer 112 may remain in the bending area BA. However, embodiments are not limited thereto. Referring to FIG. 14C, for example, the bending area BA may exclude an entirety of the remaining inorganic layers in the bending area BA (e.g., the barrier layer 112). When the barrier layer 112 is entirely removed in the bending area BA by the over-etching in the process of providing or forming the first source metal pattern, the filling member FL may contact the base substrate 110. As being in contact, elements may form an interface therebetween.

Figure 15A:
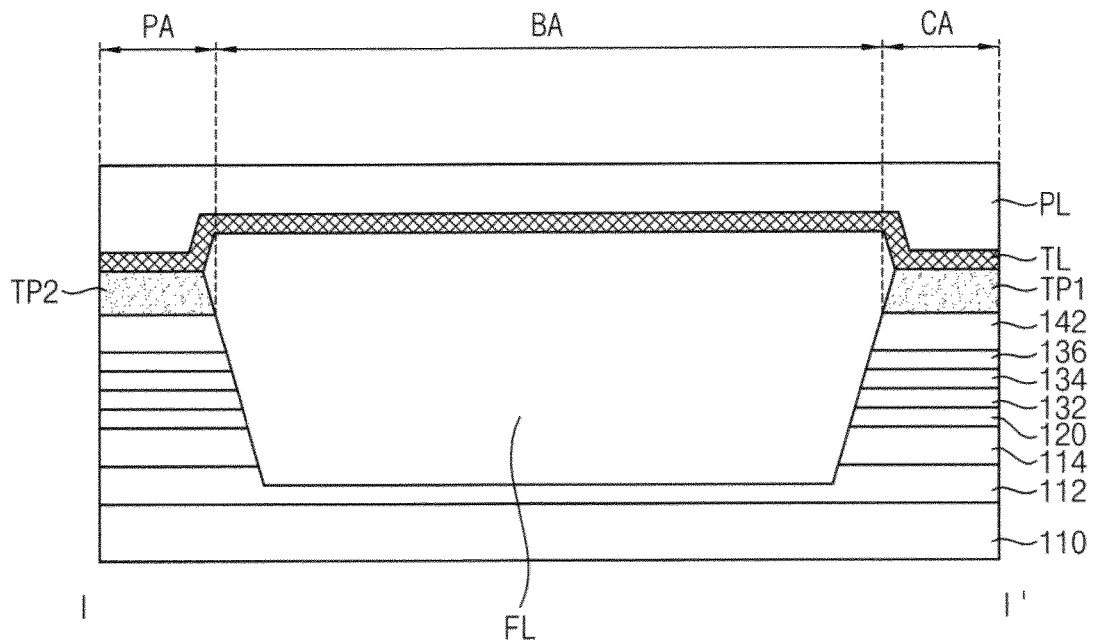

Referring to FIG. 15A, a seventh insulation layer 162 is provided or formed to cover the second source metal pattern. The seventh insulation layer 162 includes an organic insulation material. The seventh insulation layer 162 may be referred to as a second via insulation layer or a second organic insulation layer.

A first electrode EL1 of an organic light-emitting diode 200 and a pixel-defining layer PXL are provided or formed on the seventh insulation layer 162. An organic light-emitting layer OL of the organic light-emitting diode 200 is provided or formed on the first electrode EL1. A second electrode EL2 of the organic light-emitting diode 200 is provided or formed on the organic light-emitting layer OL.

Figure 15B:
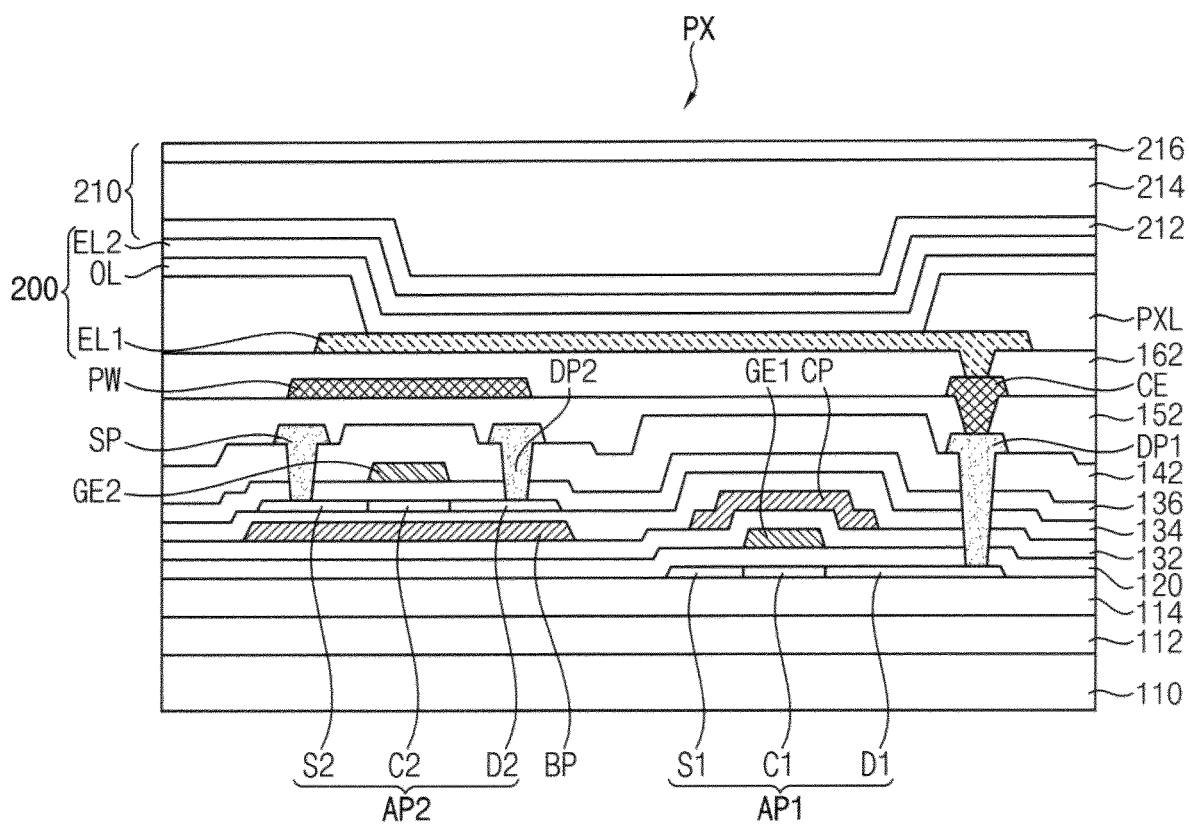

An encapsulation layer 210 may be formed on the organic light-emitting diode 200. In an embodiment, for example, the encapsulation layer 210 may have a stacked structure including inorganic thin films 212 and 216 and an organic thin film 214. In an embodiment, a pixel circuit may include in order from the base substrate 110, a first active pattern AP1, a first gate metal pattern corresponding to the first active pattern AP1, a second gate metal pattern, a second active pattern AP2 corresponding to the second gate metal pattern, and a third gate metal pattern. Referring to FIG. 15B, a protective layer PL may be provided or formed to cover the transfer wiring TL in the bending area BA. The protective layer PL may include an organic material. In an embodiment, for example, the protective layer PL may be provided or formed in the process of forming the seventh insulation layer 162 so that the protective layer PL may include a same material as the seventh insulation layer 162 and may be in a same layer as the seventh insulation layer 162. In an embodiment, at least a portion of the protective layer PL may be provided or formed in the process of providing or forming the pixel-defining layer PXL so that the protective layer PL may include a same material as the pixel-defining layer PXL and may be in a same layer as the pixel-defining layer PXL.

According to embodiments, thickness portions of inorganic layers disposed in a pixel area PX and in a bending area BA may be excluded or removed through a same photolithography process. A remaining thickness portion of an inorganic layer may be removed by over-etching in a following etching process. Thus, an additional photolithography process for individually etching the inorganic layers in the bending area BA may be removed.

Embodiments may be applied to various display devices. One or more embodiment may be applied to vehicle-display device, a ship-display device, an aircraft-display device, a portable communication device, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings and features of the invention. Accordingly, all such modifications are intended to be included within the scope of the invention. Therefore, it is to be understood that the foregoing is illustrative of various embodiments and is not to be construed as limited to the specific embodiments disclosed, and that modifications to the disclosed embodiments, as well as other embodiments, are intended to be included within the scope of the invention, as set forth in the following claims and equivalents thereof.

What is claimed is:

1. A method for providing a display device, the method comprising:
    providing a base substrate including a bending area at which the base substrate is bendable and a display area including a pixel area;
    providing in the pixel area:
        a pixel circuit comprising in order from the base substrate, a first active pattern, a first gate metal pattern corresponding to the first active pattern, a second gate metal pattern, a second active pattern corresponding to the second gate metal pattern, and a third gate metal pattern;
        a first inorganic layer and a second inorganic layer between the base substrate and the first active pattern;
        a third inorganic layer between the first active pattern and the first gate metal pattern;
        a fourth inorganic layer between the first gate metal pattern and the second gate metal pattern;
        a fifth inorganic layer between the second gate metal pattern and the second active pattern;
        a sixth inorganic layer between the second active pattern and the third gate metal pattern; and
        a seventh inorganic layer covering the third gate metal pattern,
    wherein
        the first to seventh inorganic layers in the pixel area define inorganic layers in the pixel area, and
        each of the first to seventh inorganic layers in the pixel area extends to the bending area to define inorganic layers in the bending area;
    providing a first photoresist pattern on the seventh inorganic layer in both the pixel area and the bending area, the first photoresist pattern defining:
        a first opening which corresponds to the bending area and extends to the inorganic layers in the bending area, and
        a second opening which corresponds to a portion of the second active pattern and extends to the inorganic layers in the pixel area;
    providing by a first inorganic layer etching process using the first photoresist pattern as a first mask, both:
        at the first opening, at least one of the inorganic layers in the bending area which is etched, and
        at the second opening, providing at least one of the inorganic layers in the pixel area which is etched;
    providing a remaining photoresist pattern by reducing a thickness of the first photoresist pattern in both the pixel area and the bending area, the remaining photoresist pattern defining:
        a first remaining opening corresponding to the first opening in the bending area,
        a second remaining opening corresponding to the second opening in the pixel area, and
        a third opening which corresponds to a portion of the second active pattern in the pixel area and extends to the inorganic layers in the pixel area; and
    providing by a second inorganic layer etching process using the remaining photoresist pattern as a remaining mask, each of:
        at least one of the inorganic layers at the first remaining opening which is etched to define remaining inorganic layers in the bending area,
        a first contact hole which corresponds to the second opening and exposes the first active pattern to outside the remaining photoresist pattern, and
        a second contact hole which corresponds to the third opening and exposes the second active pattern to outside the remaining photoresist pattern.

2. The method of claim 1, wherein the first to seventh inorganic layers each includes at least one of silicon oxide, silicon nitride and silicon oxynitride.

3. The method of claim 1, wherein the first inorganic layer etching process using the first photoresist pattern as the first mask further provides both:
    at the first opening, the bending area excluding the seventh inorganic layer and the sixth inorganic layer, and
    the seventh inorganic layer and the sixth inorganic layer excluded at the second opening.

4. The method of claim 1, further comprising:
    providing in both the bending area and the pixel area,
        a first source metal layer on the seventh inorganic layer, and
        a second photoresist pattern on the first source metal layer; and
    providing by etching the first source metal layer by using the second photoresist pattern as a second mask, both:
        a first source metal pattern, and
        the bending area excluding at least a portion of the remaining inorganic layers in the bending area.

5. The method of claim 4, wherein the bending area excludes an entirety of the remaining inorganic layers in the bending area.

6. The method of claim 4, wherein the first source metal pattern includes:
    a drain pattern which is electrically connected to the first active pattern at the first contact hole, and
    a source pattern which is electrically connected to the second active pattern at the second contact hole.

7. The method of claim 4, further comprising:
    providing a first organic insulation layer covering the first source metal pattern; and providing a second source metal pattern on the first organic insulation layer.

8. The method of claim 7, wherein
the first organic insulation layer defines a filling member which fills an entirety of an area from which the portion of the remaining inorganic layers is removed in the bending area, and
the second source metal pattern includes a transfer wiring which covers the filling member in the bending area and through which an electrical signal is provided to the pixel area from outside the bending area.

9. The method of claim 1, wherein
the first active pattern includes polysilicon, and
the second active pattern includes a metal oxide.

10. A method for providing an electrical device, the method comprising:
providing a base substrate of a display device, the base substrate including a bending area at which the base substrate is bendable and a display area including a pixel area;
providing in the pixel area:
a pixel circuit comprising in order from the base substrate, a first active pattern, a first gate metal pattern corresponding to the first active pattern, a second gate metal pattern, a second active pattern corresponding to the second gate metal pattern, and a third gate metal pattern;
a first inorganic layer and a second inorganic layer between the base substrate and the first active pattern;
a third inorganic layer between the first active pattern and the first gate metal pattern;
a fourth inorganic layer between the first gate metal pattern and the second gate metal pattern;
a fifth inorganic layer between the second gate metal pattern and the second active pattern;
a sixth inorganic layer between the second active pattern and the third gate metal pattern; and
a seventh inorganic layer covering the third gate metal pattern,
wherein
the first to seventh inorganic layers in the pixel area define inorganic layers in the pixel area, and
each of the first to seventh inorganic layers in the pixel area extends to the bending area to define inorganic layers in the bending area;
providing a first photoresist pattern on the seventh inorganic layer in both the pixel area and the bending area, the first photoresist pattern defining:
a first opening which corresponds to the bending area and extends to the inorganic layers in the bending area, and
a second opening which corresponds to a portion of the second active pattern and extends to the inorganic layers in the pixel area;
providing by a first inorganic layer etching process using the first photoresist pattern as a first mask, both:
at the first opening, at least one of the inorganic layers in the bending area which is etched, and
at the second opening, providing at least one of the inorganic layers in the pixel area which is etched;
providing a remaining photoresist pattern by reducing a thickness of the first photoresist pattern in both the pixel area and the bending area, the remaining photoresist pattern defining:
a first remaining opening corresponding to the first opening in the bending area,
a second remaining opening corresponding to the second opening in the pixel area, and
a third opening which corresponds to a portion of the second active pattern in the pixel area and extends to the inorganic layers in the pixel area; and
providing by a second inorganic layer etching process using the remaining photoresist pattern as a remaining mask, each of:
at least one of the inorganic layers at the first remaining opening which is etched to define remaining inorganic layers in the bending area,
a first contact hole which corresponds to the second opening and exposes the first active pattern to outside the remaining photoresist pattern, and
a second contact hole which corresponds to the third opening and exposes the second active pattern to outside the remaining photoresist pattern.

* * * * *